United States Patent
Chen et al.

(10) Patent No.: US 12,197,123 B2
(45) Date of Patent: Jan. 14, 2025

(54) METHODS FOR MAKING SEMICONDUCTOR-BASED INTEGRATED CIRCUITS

(71) Applicant: TAIWAN SEMICONDUCTOR MANUFACTURING COMPANY LTD., Hsinchu (TW)

(72) Inventors: Yu-Hao Chen, Hsinchu (TW); Hui-Yu Lee, Hsin-Chu (TW); Jui-Feng Kuan, Hsinchu (TW); Chien-Te Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/490,794

(22) Filed: Oct. 20, 2023

(65) Prior Publication Data
US 2024/0045322 A1   Feb. 8, 2024

Related U.S. Application Data

(62) Division of application No. 17/209,701, filed on Mar. 23, 2021, now Pat. No. 11,852,967.

(60) Provisional application No. 63/129,373, filed on Dec. 22, 2020.

(51) Int. Cl.
*G03F 1/36* (2012.01)
*G06F 30/398* (2020.01)

(52) U.S. Cl.
CPC .............. *G03F 1/36* (2013.01); *G06F 30/398* (2020.01)

(58) Field of Classification Search
CPC . G03F 1/36; G03F 7/00; G06F 30/398; G06F 30/394; H01L 21/0274
See application file for complete search history.

(56) References Cited

U.S. PATENT DOCUMENTS

| | | | |
|---|---|---|---|
| 10,276,394 B2 * | 4/2019 | Hsieh | G06F 30/398 |
| 2010/0183961 A1 | 7/2010 | Shieh et al. | |
| 2015/0143319 A1 | 5/2015 | Lee et al. | |
| 2019/0080921 A1 * | 3/2019 | Hsieh | G03F 7/70425 |

FOREIGN PATENT DOCUMENTS

TW          201823852 A     7/2018

OTHER PUBLICATIONS

English Abstract Translation of TW201823852A.

* cited by examiner

*Primary Examiner* — Stewart A Fraser
(74) *Attorney, Agent, or Firm* — WPAT LAW; Anthony King

(57) ABSTRACT

A method for making a IC is provided, including: identifying, in a schematic, first and second edge elements, which edge elements including devices whose layout patterns are configured to conform to a first layout grid; identifying all the elements between the first and second edge elements, at least one of the identified elements including a device whose layout pattern is configured to conform to a second layout grid that is finer than the first layout grid; and calculating a spatial quantity of a combined layout pattern of the identified elements between the first and second edge elements to determine whether the combined layout pattern conforms to the first layout grid.

20 Claims, 23 Drawing Sheets

METHODS FOR MAKING SEMICONDUCTOR-BASED INTEGRATED CIRCUITS

PRIORITY CLAIM AND CROSS-REFERENCE

This application is a Divisional application of pending U.S. patent application Ser. No. 17/209,701 filed on Mar. 23, 2021, entitled "METHODS FOR MAKING SEMICONDUCTOR-BASED INTEGRATED CIRCUITS", which claims the benefit of U.S. Provisional Application No. 63/129,373, filed on Dec. 22, 2020, the disclosure of which are hereby incorporated by reference in its entirety.

BACKGROUND

An integrated circuit ("IC") includes one or more devices made of semiconductors and other appropriate materials. One way in which to represent a semiconductor device is with a plan view diagram referred to as a layout diagram. A layout diagram is hierarchical and is broken down into modules which carry out higher-level functions as required by the IC's design specifications.

As demand for more sophisticated ICs continues to increase, it is possible that the manufacturing throughput temporarily fails to meet the demand. Moreover, manufacturing costs continue to face downward pressure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
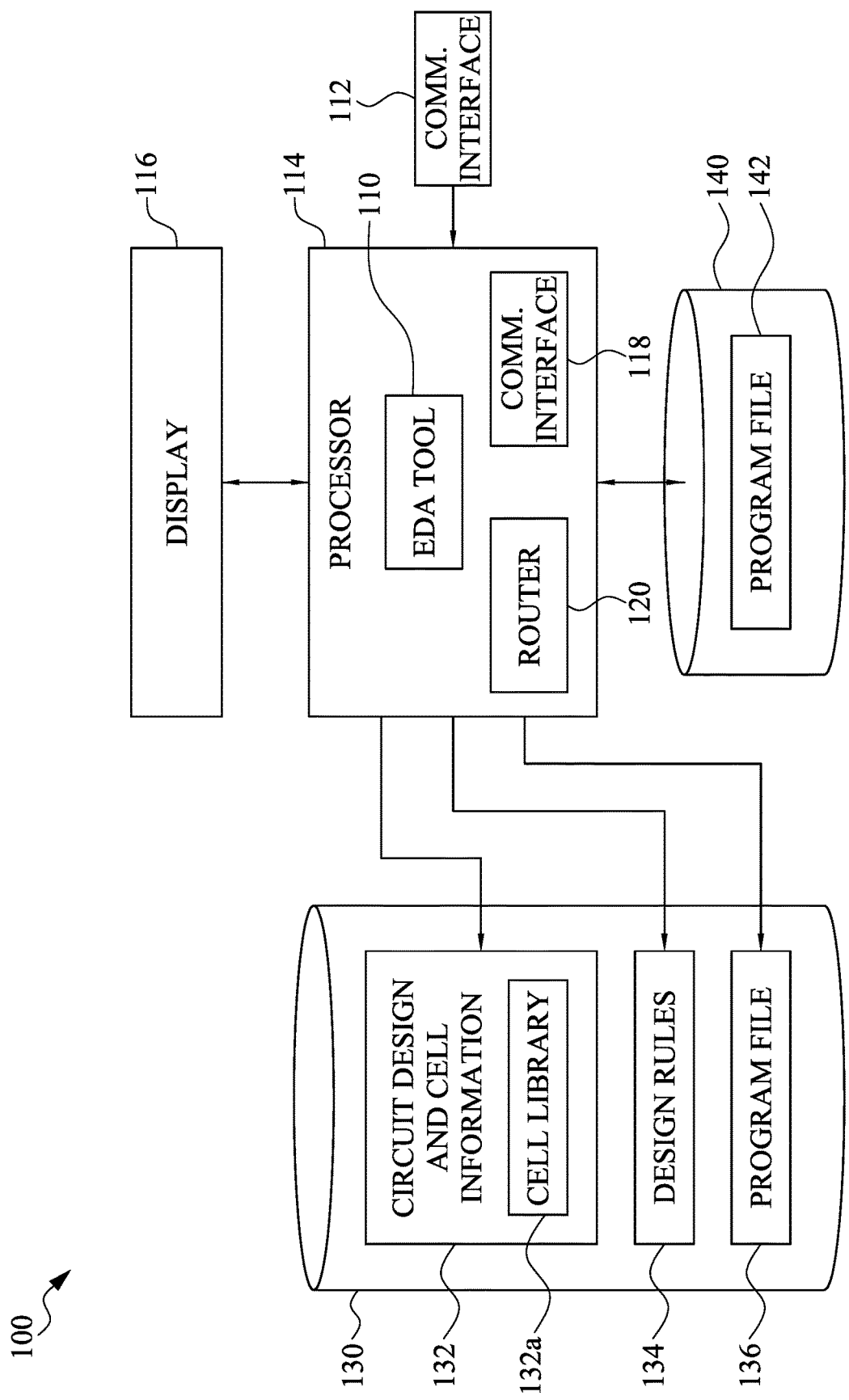
FIG. 1 illustrates an exemplary EDA system 100 in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° or at other orientations) and the spatially relative descriptors used herein may likewise be interpreted accordingly.

In the present disclosure, a layer, a pattern, or a structure extending in one direction means that a dimension of the layer, the pattern, or the structure in the extended direction is greater than another dimension of the layer, the pattern, or the structure in another dimension substantially perpendicular to the extended direction.

In the present disclosure, the phrase "one of A, B and C" means "A, B and/or C" (A, B, C, A and B, A and C, B and C, or A, B and C), and does not mean one element from A, one element from B and one element from C, unless otherwise described.

Further, it will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about"

means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, not every layer of a cell or a layout is depicted in the drawings One of ordinary skill in the art should understand that the cell or the layout can include more layers to implement functionality of the cell, and these layers are omitted merely for convenience of description.

Figure 10:
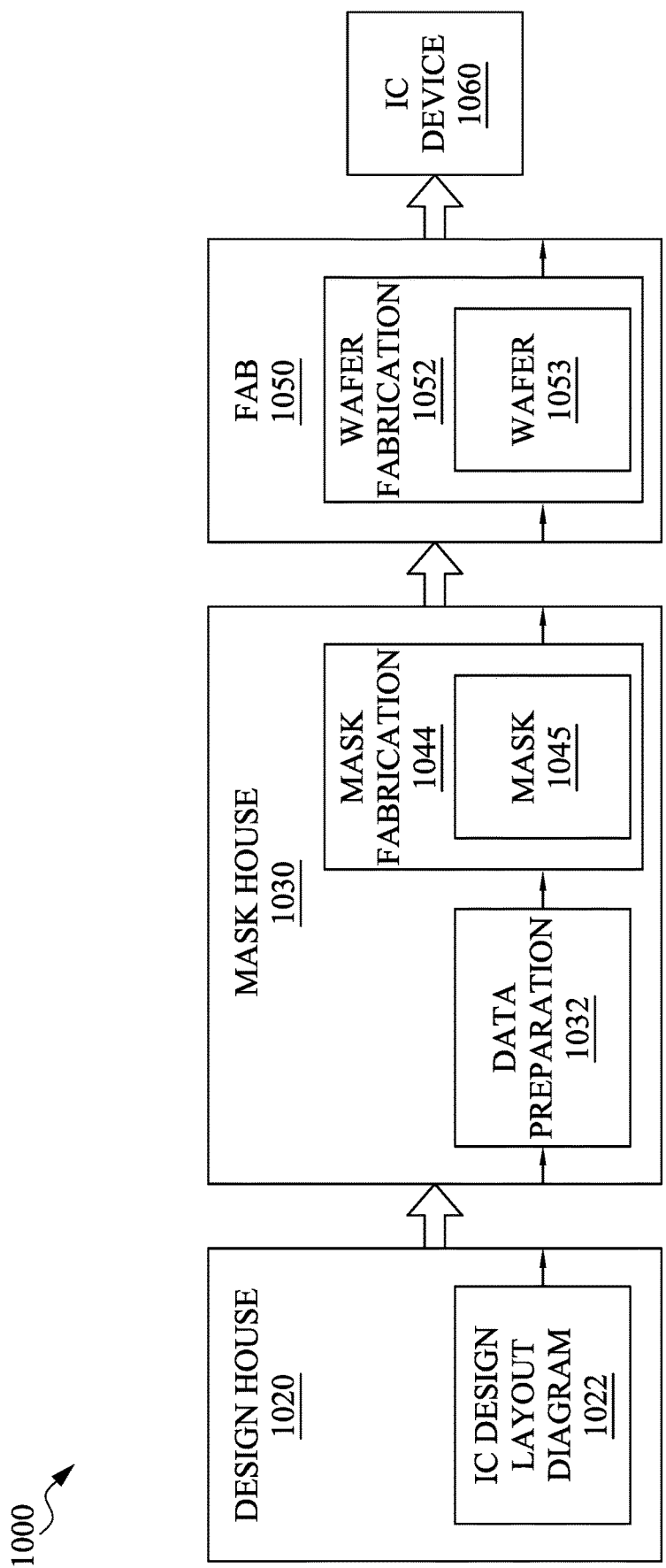
FIG. 10 shows a block diagram of an IC manufacturing system and an associated manufacturing flow, in accordance with some embodiments of the present disclosure.

The design and fabrication of an integrated circuit (IC) is a collective effort. FIG. 10, which is a block diagram of an IC manufacturing system 1000 and an associated manufacturing flow, shows an example of how such collective effort is arranged. The system 1000 may be used to fabricate, based on a layout diagram, one or more photomasks, or at least one component in a layer of an IC, or a combination of both.

The system 1000 includes entities that interact and communicate with one another during the design, development, and manufacturing cycles related to the manufacturing of an IC device 1060. These entities may include a design house 1020, a mask house 1030, and an IC manufacturer/fabricator ("fab") 1050. A plurality of these entities may be owned by a single company, or may coexist in a common facility with shared resources.

The design house (or design team) 1020 generates an IC design layout diagram 1022 that includes various geometrical patterns for the IC device 1060. These patterns may correspond to patterns of different materials (such as metal, oxide and semiconductor) and in different layers of the IC device 1060, the patterns of which may combine to form various features, such as active regions, (gate) electrodes, sources/drains, metal lines, vias, openings for bonding pads, and optical devices.

The IC design layout diagram 1022 is presented in data files (such as GDSII or DFII file format) with information on the patterns, and may conform to various characteristics suitable for subsequent mask and wafer fabrication.

The mask house 1030 performs mask data preparation 1032 and mask fabrication 1044 to produce mask(s) 1045 based at least in part on the layout diagram 1022.

The fab 1050 includes wafer fabrication 1052, which turns out wafers 1053 that will become IC devices 1060, and may have a variety of manufacturing facilities for that end. For example, different such facilities may be employed to make the FEOL and BEOL sections. The fab 1050 directly uses mask(s) 1045 and therefore at least indirectly uses the layout diagram 1022 in the making of the IC devices 1060.

One of the fabrication steps is the (photolithographic) transferal of patterns to the wafer 1053. The patterns can be at the scale of nanometers, so their location in each of the layers has to be carefully defined during the circuit design stage. Also, the manufacturing process is carefully controlled to ensure accuracy in the placement of the patterns.

Layout patterns cannot be arbitrarily placed. Rules exist to govern the relative spacing of the layout patterns in order to ensure the patterns can be accurately transferred to the wafer during manufacturing. These are often referred to as design rules, which the layout 1022 is required to comply with. For easy compliance, the fab 1050 can define a minimum manufacturing grid on which layout patterns may be placed. The minimum manufacturing grid may be referred to as the minimum grid, or simply "the grid."

The fab 1050 usually provides the minimum grid for a specific manufacturing process to the providers of electronic design automation (EDA) tools. The EDA tools will use these grids in their database. A given grid usually indicates the capability of the associated manufacturing process.

Usually, with respect to the fab 1050, it is preferable for circuit designers to place their layout patterns on the grid. In the context of the present disclosure, a pattern is "on-grid" if the corners of the pattern are on the intersections of the grid lines. For example, a rectangular conductive line is on-grid if all four corners are placed in alignment with the grid line intersections.

To further illustrate how a layout 1022 may be generated, refer to FIG. 1, which illustrates an exemplary EDA system 100. The system 100 includes an EDA tool 110 and a place-and-route tool that has a chip assembly router 120.

The EDA tool 110 may be formed by retrieving program instructions 136 from computer readable storage medium 130, 140 and executing these instructions on a general purpose processor 114. The EDA tool 110 may be connected to a display 116 and a user interface 112, such as a mouse, a touch screen, a microphone, a trackball and a keyboard. The storage medium 130, 140 may store circuit design and cell information 132 (which may include a cell library 132a), design rules 134, program files 136, and graphical data system ("GDS") II files 142.

To allow data transfer with external devices, the EDA tool 110 may include a communication interface 118, such as a modem, an Ethernet card, a wireless network card, a Personal Computer Memory Card International Association ("PCMCIA") slot and card and the like.

The router 120 can identify the cells to be included in a layout, such as a list 132 of pairs of cells that are to be interconnected and may be selected from the cell library 132a. Design rules 134 may be used for a variety of processing technologies, and may configure the router 120 to locate connecting lines and vias on a manufacturing grid.

Figure 2:
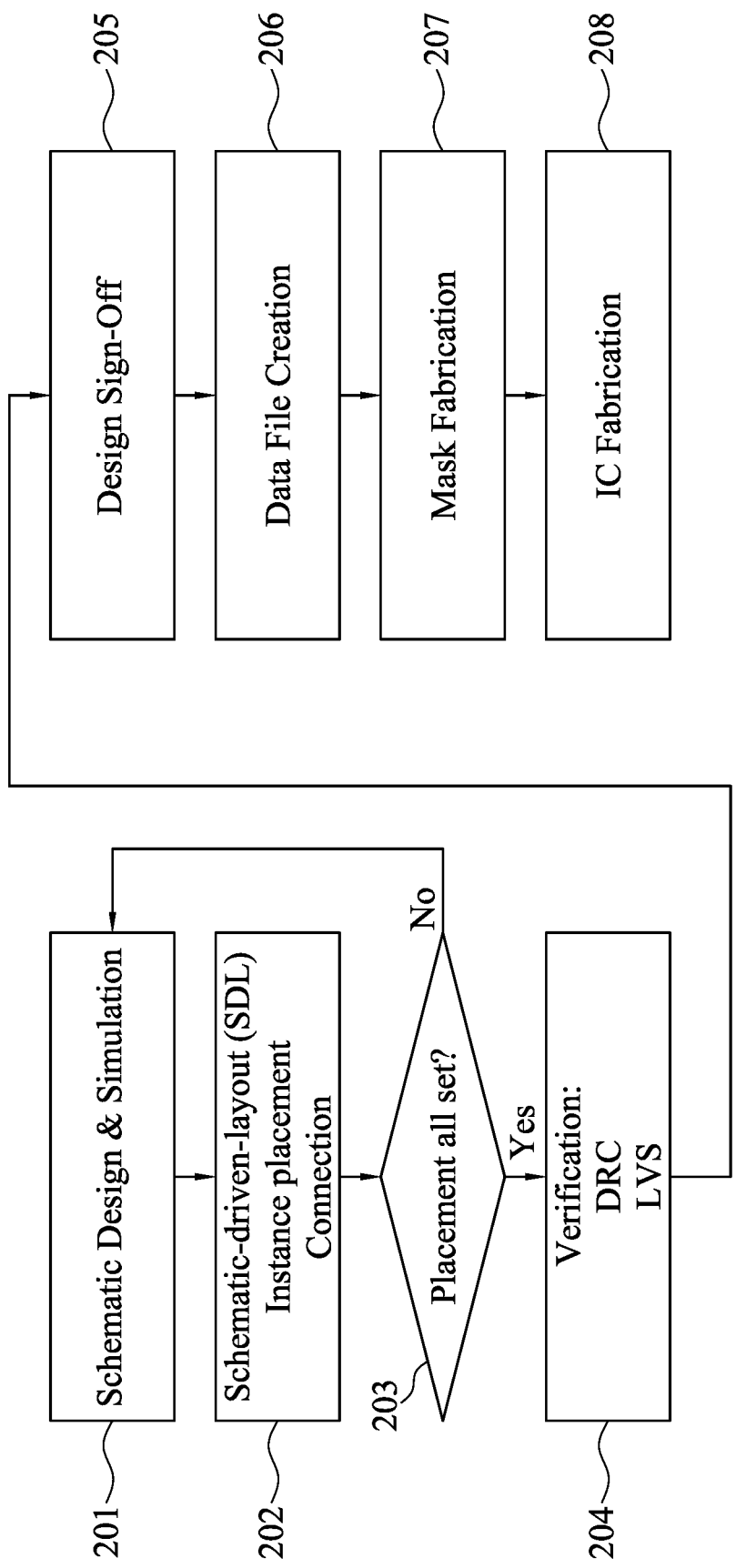
FIG. 2 illustrates a flowchart for the design and fabrication of an IC in accordance with some embodiments of the present disclosure.

FIG. 2 illustrates a flowchart for the design and fabrication of an IC from another viewpoint. The flowchart of FIG. 2 may illustrate another possible collaboration arrangement in IC design and fabrication.

Step 201 involves the functional design of an IC or a block within an IC. The designer may start from a functional and performance specification, and arrange circuit devices, blocks and modules to achieve the desired function/performance. The devices, blocks and modules may be represented by symbols placed in a schematic diagram. The designer may then determine how the symbols should be connected. The design may conclude upon a simulation of the circuit demonstrating satisfactory function and performance.

Figure 3A:
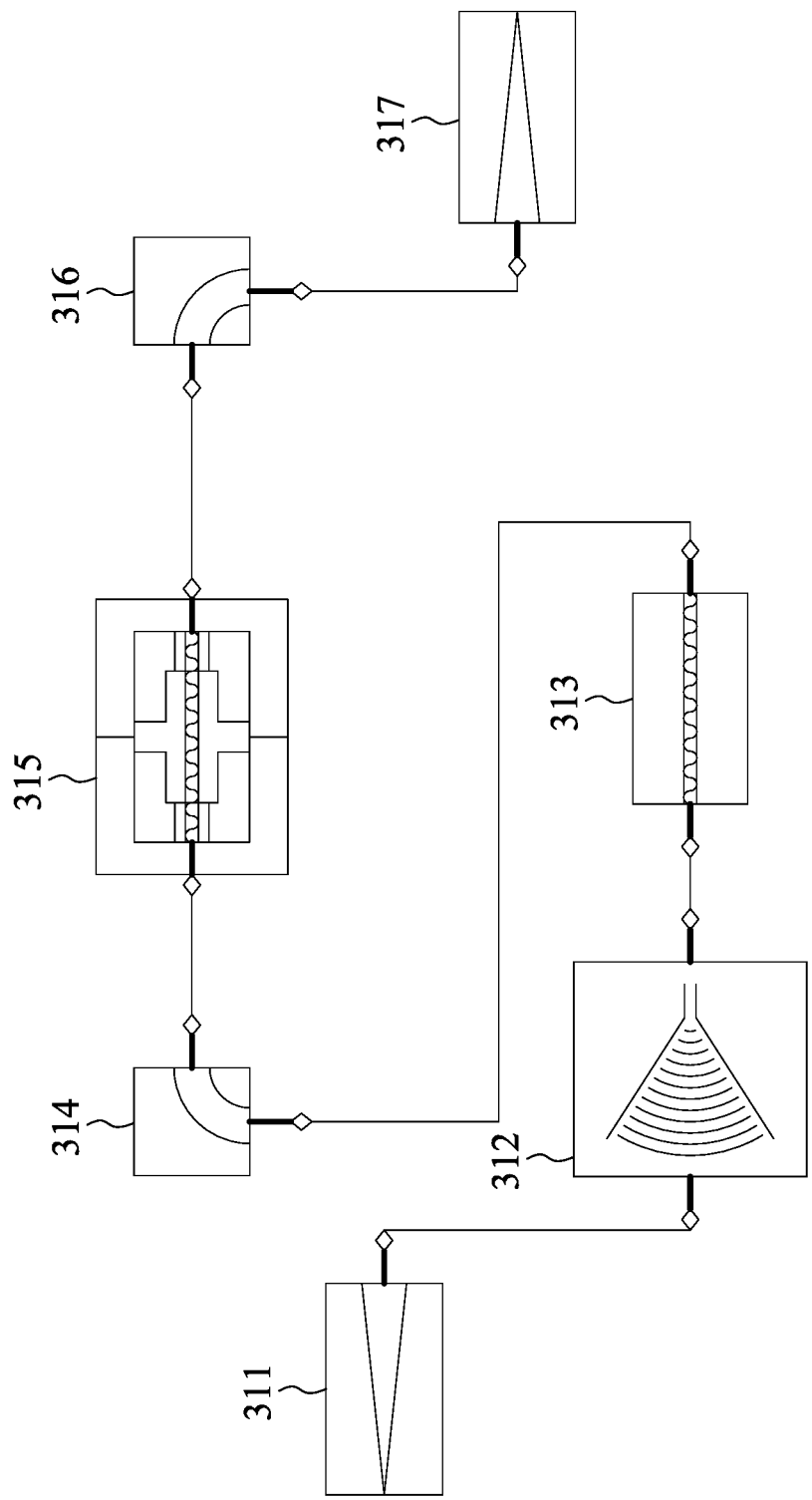
FIG. 3A illustrates an exemplary schematic diagram in accordance with some embodiments of the present disclosure.

FIG. 3A illustrates an exemplary schematic diagram having various devices, blocks and modules represented by symbols 311 to 317. Symbols 311 and 317 represent ribs that may serve as a terminal section or a transition section in an electro-optical circuit. Symbol 312 may represent optical input/output such as grating coupler or edge coupler. Symbol 313 may represent a waveguide. Symbols 314 and 316 may represent waveguides having a 90-degree bend. Symbol 315 may represent a phase shifter.

Each of the symbols 311 to 317 include one or two thicker solid lines indicating the terminals for connection with other symbols. However, these thick solid lines may be simply schematic and do not necessarily mean that corresponding protrusions exist in the layout.

The symbols 311 to 317 may be connected to each other, as indicated by the solid line that may exist between the connection terminals of different symbols. These solid lines may be simply schematic and do not necessarily indicate the length and/or orientation of the connection in the layout. In some cases, a solid line in the schematics may simply indicate an electrical and/or optical connection between two symbols that are directly in contact with each other without any intervening electrical and/or optical wiring.

In some cases, the circuits are designed not with schematic symbols but with hardware description language.

Refer back to FIG. 2. In step 202, the designed circuits (in schematics, for example) are sent to layout engineers and/or layout service providers. The EDA software tool may link the schematics and layout databases and generate the layout of the circuit under design automatically or semi-automatically, in a fashion that may be termed as schematic-driven-layout (SDL). Step 202 may involve the placement of various circuit instances, each of which may include one or more layout patterns. Step 202 may also involve creating the interconnection between the layout patterns in the layout diagram. The interconnection may be optical and/or electrical.

Figure 3C:
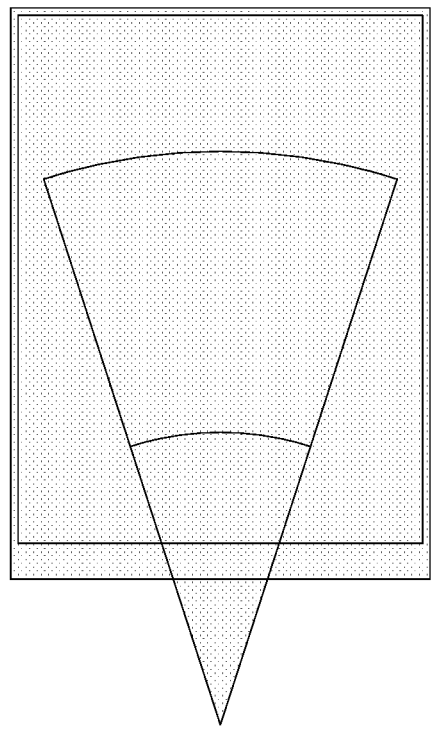
FIGS. 3B through 3G illustrate examples of the layout of several circuit blocks, in accordance with some embodiments of the present disclosure.
Figure 3B:
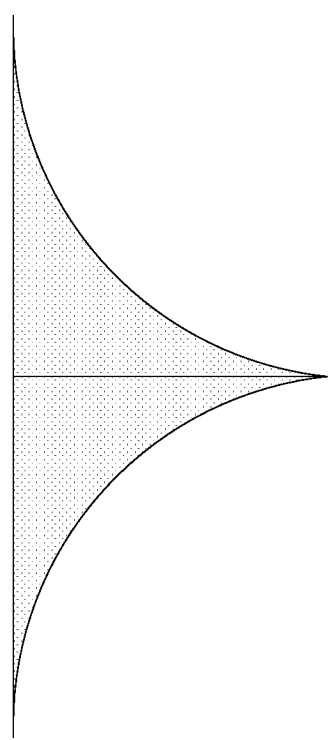
Figure 3E:
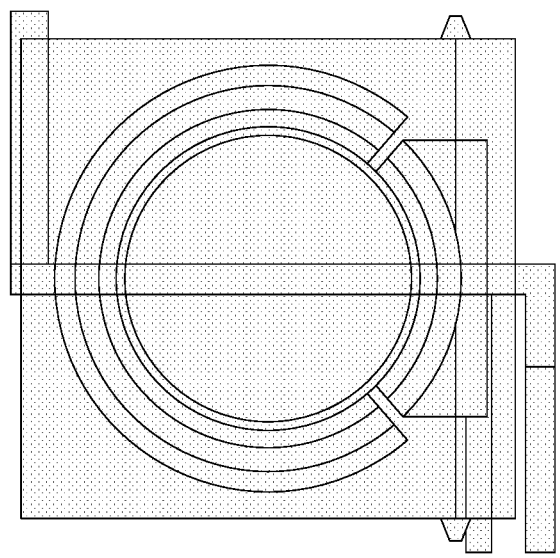
Figure 3D:
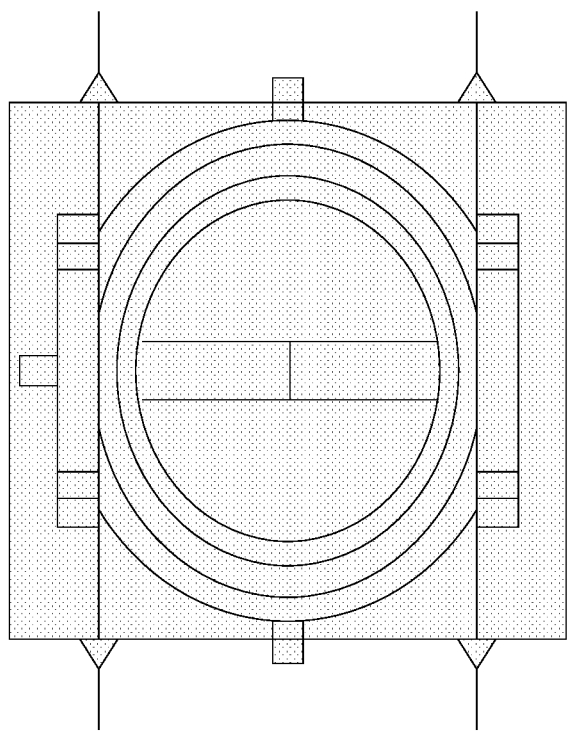
Figure 3F:
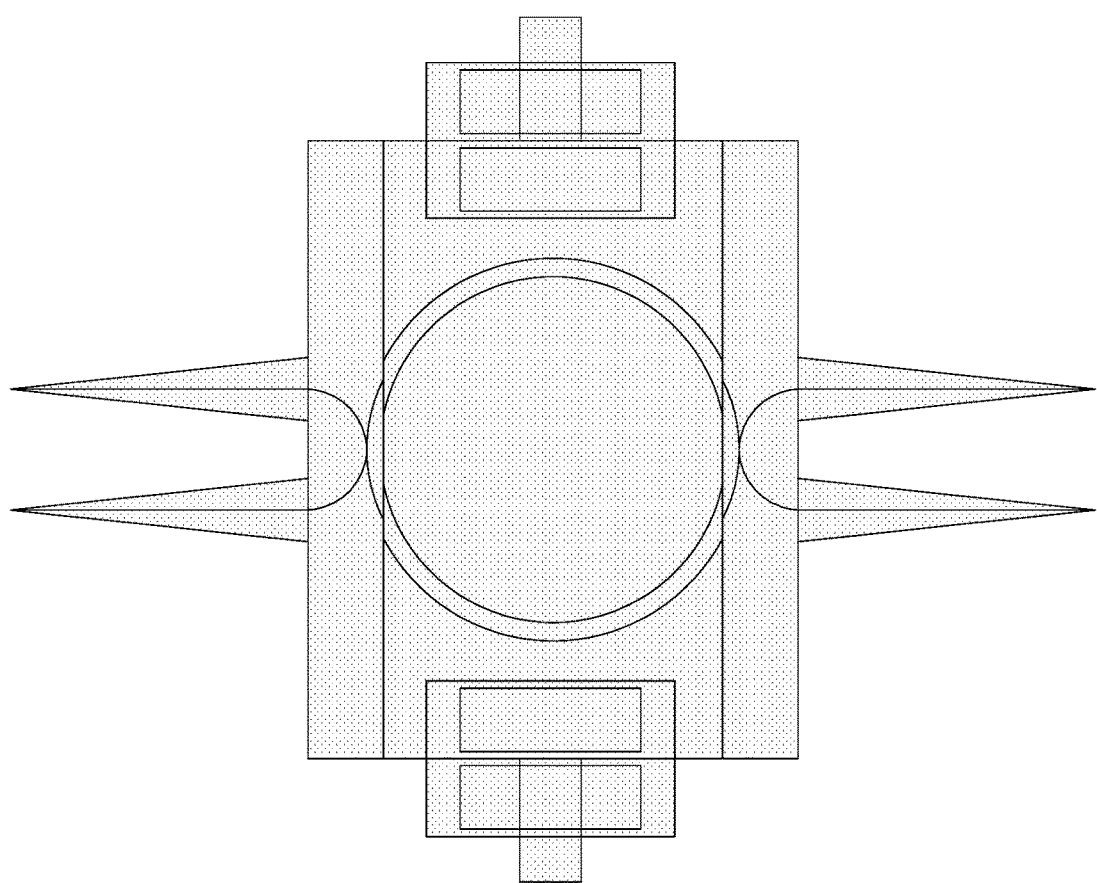
Figure 3G:
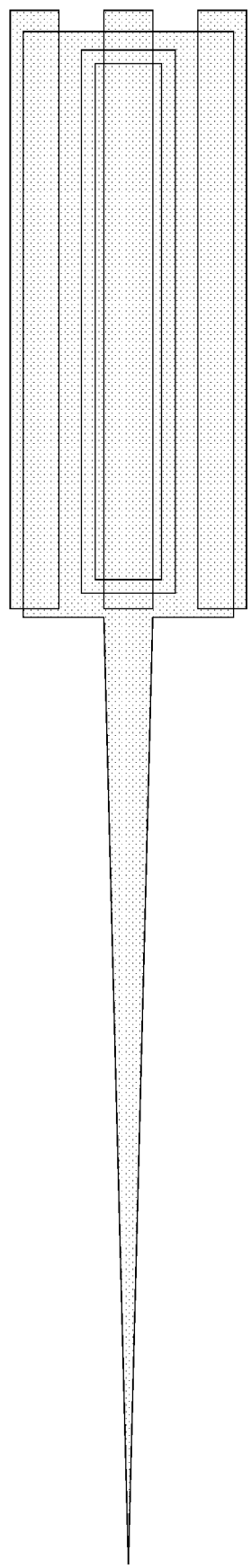

FIGS. 3B through 3G illustrate examples of the layout of several circuit blocks. FIG. 3B illustrates a Bragg-reflector. FIG. 3C illustrates a grating coupler. FIG. 3D illustrates a ring modulator. FIG. 3E illustrates a ring modulator. FIG. 3F illustrates a micro-ring phase shifter. FIG. 3G illustrates a terminator (low reflection terminator).

Refer back to FIG. 2. As mentioned above, the layout pattern may need to conform to various rules to ensure manufacturability and/or yield. One of the rules may be that all the layout patterns are on-grid. This may be checked in step 203.

However, there can be occasions where the layout engineers and/or layout service providers cannot successfully generate a layout with all the layout patterns placed on-grid. In such a case, the schematics will be sent back to the designers for further changes. The iterative nature of this process may be time-consuming.

After the placement is all set, the generated layout may have to go through further tests, such as design rules check (DRC) and layout versus schematic (LVS), as indicated in step 204. When all the relevant tests are passed, the circuit design can be signed off (step 205), and the layout may be converted into one or more data files (step 206) for mask fabrication (step 207) and IC fabrication (step 208).

As mentioned above, ICs are usually (although not always) made of semiconductor devices and conductive interconnections, and may usually include several layers. Each layer comprises various circuit elements, devices and wires. Different layers can be connected by interconnections such as vias.

In some manufacturing technologies, each layer is made with a plurality of steps based on (photo-)lithographic techniques using a mask having related layout patterns. The patterns can be transferred to a wafer (which may be based on semiconductor) to form structures with the physical characteristics for which the structures are designed. Such structures can be referred to as featured structures. The physical characteristics may be electrical or optical or both.

The lithographic process is a main factor of how small the featured structures can get in each layer. A parameter that is related to the lithographic process and characterizes the smallest possible feature size may be called a critical dimension. The term "resolution" can also characterize this aspect of the lithographic process: a higher resolution typically means a smaller critical dimension and therefore may be suitable for making very small devices.

The lithographic process is, however, also a main cost component in the manufacturing process. A higher-resolution lithographic process (sometimes called "more advanced") is usually more costly than a lower-resolution lithographic process.

It may be desirable to employ a more advanced lithographic process for the fabrication of layers that require small feature sizes and/or high device density. An example is the layer(s) that is in or immediately above the semiconductor wafer, where active devices such as transistors are made. A large quantity of transistors is often desirable to increase the computing power of the integrated circuit. Another example is the layer in which sensitive optical components are made, such as waveguides. Optical components do not necessarily require a large quantity and can be sensitive to the precision of their sizes. Yet another example is the layers that are made with the so-called front-end-of-line (FEOL) process, or simply the FEOL or the FEOL section of the integrated circuit. For these layers, the cost of the more advanced lithographic process may be justified.

However, some layers do not necessarily require high-density devices or very precise control of the device size. An example is the layer(s) in which conductive interconnection (made with, for example, metals such as copper and aluminum) is made to connect devices in the same or other layers. Another example is the conductive vias that connect different layers. Yet another example is the layers that are made with the so-called back-end-of-line (BEOL) process, or simply the BEOL or the BEOL section of the integrated circuit. For these layers, the cost of advanced lithography may be acceptable but also sub-optimal.

Hence, it may be advantageous to employ different lithographic processes with different resolution to make layers or sections of an IC that have different requirements for size, precision and/or critical dimension. In addition to a lowered cost while having the same lithographic performance, the manufacturing resources may be more efficiently utilized because advanced lithography can be a bottleneck in the fabrication process.

As mentioned above, the IC fab usually provides the grids, and each layout pattern in a layout diagram of a layer is usually required to be on-grid. The grid size may vary according to the resolution of the associated lithographic process. Hence, an IC may include a layout that has to be "on" a smaller (or finer) grid (such as with a grid size of 1 nm or 2 nm) for a layer or section that is to be fabricated with a more advanced lithographic process, and another layout that has to be "on" a larger (or coarser) grid (such as with a grid size of 5 nm or 10 nm) or a layer or section that is to be fabricated with a less advanced lithographic process.

The requirement of conformance with grids of different sizes gives rise to the possibility that the layout patterns corresponding to neighboring circuit symbols in the schematics may have to conform to different grids if the neighboring circuit symbols represent devices, blocks or sections that will be made with different lithographic processes. However, a gap may arise because a layout pattern that is "on" a finer grid is not necessarily "on" a coarser grid that its neighboring layout pattern has to conform to. This may lead to a situation where either two neighboring layout patterns are on-grid but cannot be connected, or they can be connected with one of the layout patterns being off-grid. In either case, a proper layout cannot be generated, and the circuit schematics has to be updated by the designer before another attempt to generate a proper layout, thereby adding to delays.

Figure 4A:
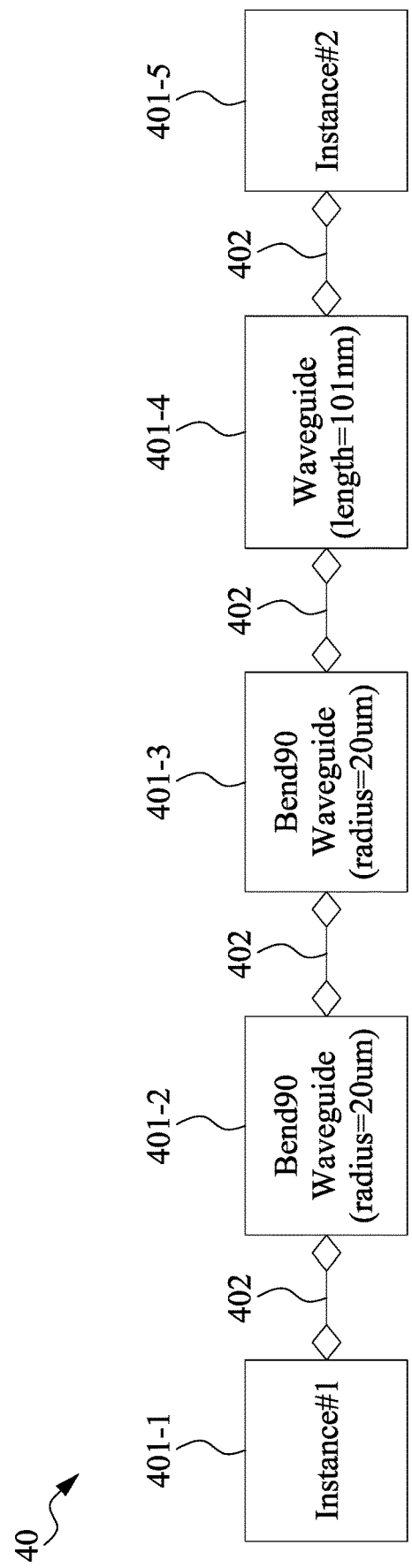
FIG. 4A illustrates an exemplary schematic diagram in accordance with some embodiments of the present disclosure.
Figure 4B:
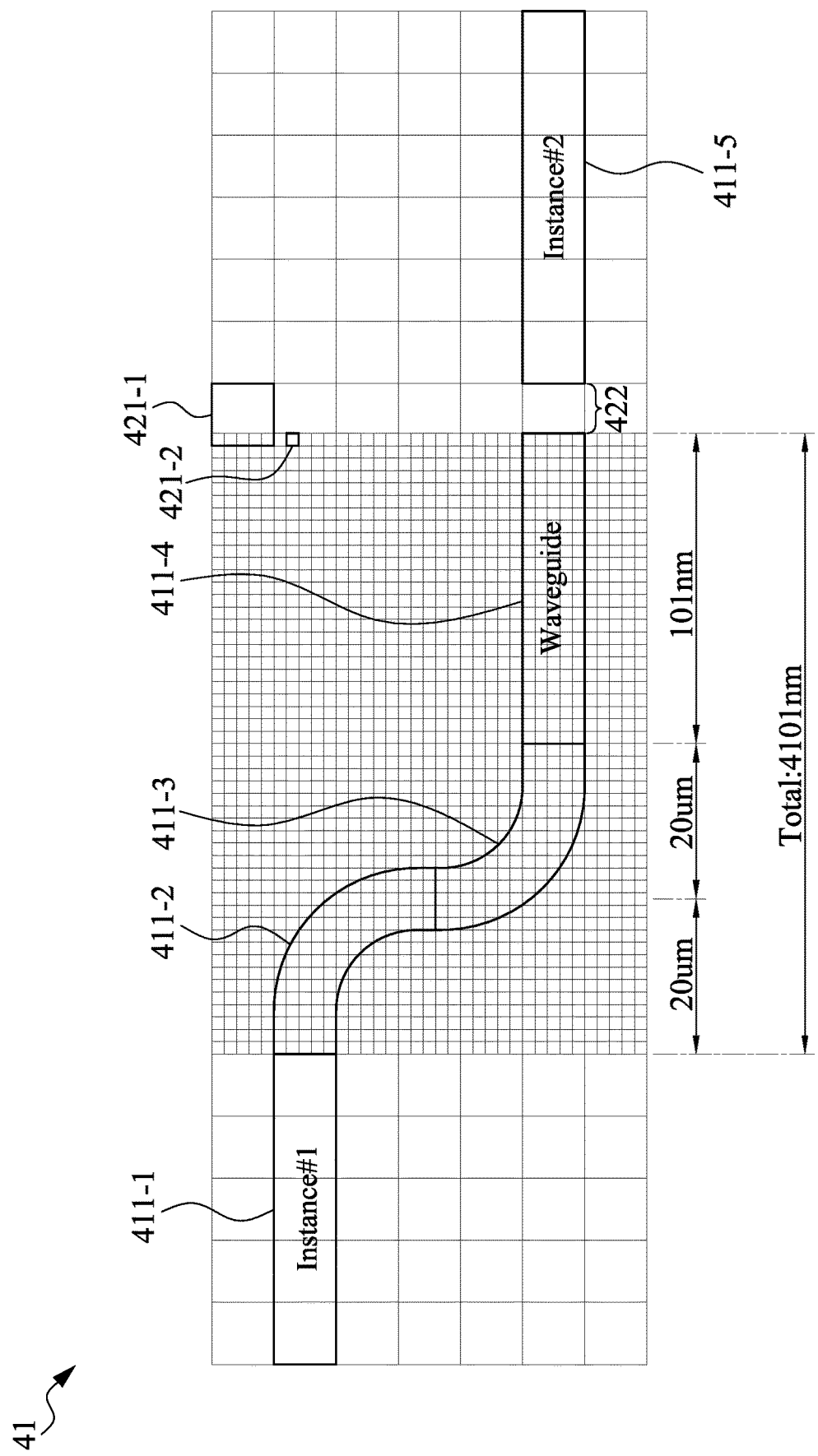
FIG. 4B illustrates a layout in accordance with some embodiments of the present disclosure.

This problem is explained in more detail, with references to FIGS. 4A and 4B. FIG. 4A illustrates an exemplary schematic diagram 40, and FIG. 4B illustrates the corresponding layout.

The schematic diagram 40 (or simply schematic) includes symbols 401-1, 401-2, 401-3, 401-4 and 401-5 representing different circuit elements. How these symbols are connected is indicated by connection 402. The circuit elements represented by the symbols 401-1, 401-2, 401-3, 401-4 and 401-5 may be configured to be fabricated in different manufacturing processes, such as different lithographic processes. In some embodiments, the fabrication of these circuit elements may involve two or more different lithographic processes, which may have two or more different critical dimensions. In some embodiments, the different lithographic processes have different resolutions. In some embodiments, the different lithographic processes have different optical resolution powers. In some embodiments, the fabrication of these circuit elements may involve two lithographic processes, with one being directed to FEOL devices, elements and sections while having a higher resolution than the other, which may be directed to BEOL devices, elements and sections, and sections or modules that include both FEOL and BEOL devices or elements.

In the example given in FIG. 4A, symbols 401-1 and 401-5 represent circuit elements (or instances) that are conductive interconnections, and symbols 401-2, 401-3 and 401-4 represent waveguides having different lengths and shapes; however, these circuit elements are only exemplary and are not limiting. For example, symbols 401-1 and 401-5 may represent BEOL devices, elements and sections. For example, symbols 401-2, 401-3 and 401-4 may represent FEOL devices, elements and sections. Moreover, symbols 401-2, 401-3 and 401-4 may represent optical, electrical and opto-electronic circuit elements.

In the example given in FIG. 4A, symbols 401-2, 401-3 and 401-4 may represent circuit elements that are configured to be fabricated with a first lithographic process having a first critical dimension. In the example given in FIG. 4A, symbols 401-1 and 401-5 may represent circuit elements that will be fabricated with a second lithographic process having a second critical dimension that is larger than the first critical dimension. That is, in the example, the layout patterns corresponding to the symbols 401-2, 401-3 and 401-4 will be drawn on a first grid having a first resolution, and the layout patterns corresponding to the symbols 401-1 and 401-5 will be drawn on a second grid having a second resolution that is lower than the first resolution so as to reflect the relative critical dimensions that may be achieved by the first and second lithographic processes.

In some embodiments, the connection 402 in the schematic 40 may represent actual wiring that has a corresponding layout pattern. In some embodiments, the connection 402 may represent a connection without actual wiring; for example, the connection 402 may indicate that the layout patterns corresponding to the symbols 401-1 and 401-2 will come into contact with each other without an intervening wiring layout pattern. In some embodiments, the rhombuses at the two ends of the connection 402 may indicate a connection by direct contact without an intervening wiring layout pattern.

The schematic 40, after the completion of its design by the circuit designer, is then sent to layout engineers, who may create a layout 41, as illustrated in the example shown in FIG. 4B. Note that for ease of illustration, the figures in FIG. 4B are not necessarily drawn to scale.

Layout patterns 411-1, 411-2, 411-3, 411-4 and 411-5 correspond to the circuit elements represented by the symbols 401-1, 401-2, 401-3, 401-4 and 401-5, respectively. In this example, the circuit elements represented by the symbols 401-1 and 401-5 are configured to be manufactured by a lithographic process having a lower resolution, and therefore the layout patterns 411-1 and 411-5 are drawn on a grid with a larger unit grid 421-1. In this example, the circuit elements represented by the symbols 401-2, 401-3 and 401-4 are configured to be manufactured by another lithographic process having a higher resolution, and therefore the layout patterns 411-2, 411-3 and 411-4 are drawn on a grid with a smaller unit grid 421-2.

All the layout patterns 411-1, 411-2, 411-3, 411-4 and 411-5 are on-grid, as indicated by the location of all corners of these layout patterns being on the grid line intersections. The two grids may overlap with each other, as indicated by the unit grid 421-1, which is illustrated as including one column of five smaller unit grids. The overlap is only partially drawn in FIG. 4B to keep the drawing uncluttered.

Although all layout patterns 411-1, 411-2, 411-3, 411-4 and 411-5 are on-grid, a gap 422 exists between the layout patterns 411-4 and 411-5, making these two patterns fail to connect to each other.

One reason that the gap 422 can arise is that a layout pattern that conforms to (or "on") the finer grid does not necessarily conform to the coarser grid even though the larger unit grid size is an integer multiple of the smaller unit grid size. That is, if the right end of the layout pattern 411-4 only occupies a fraction of the larger unit grid 421-1, then the layout pattern 411-5 cannot be extended to come into contact with the layout pattern 411-4, because that would cause the extended layout pattern 411-5 to be off-grid.

One possible solution is to extend the layout pattern 411-4 rightward to come into contact with the layout pattern 411-5. The layout pattern 411-4 would still be on-grid if it does not have to conform to the larger grid.

However, in some embodiments, the shape or dimension of the layout pattern 411-4 (such as its length) is fixed by the circuit designer during the schematic design phase and thus cannot be modified by the layout engineer. This may be the case in circumstances where precise control of the shape/dimension of the circuit elements is desirable or even required, such as opto-electronic circuits made in silicon photonics processes and 3D IC devices.

Figure 4C:
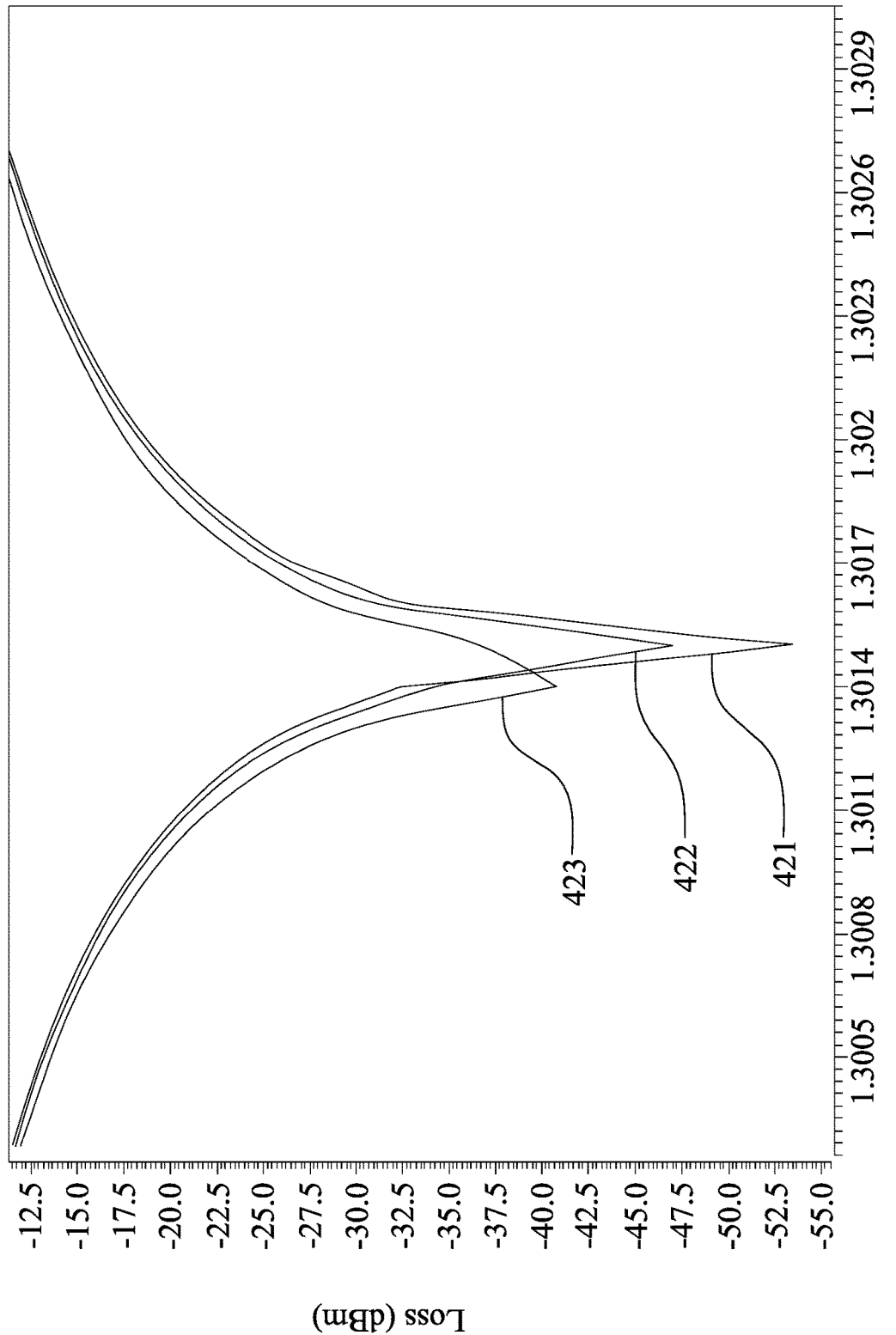
FIG. 4C is a computer simulation of the effect of size changes to a mach-zehnder modulator (MZM), in accordance with some embodiments of the present disclosure.

FIG. 4C illustrates a potential effect of changes to the dimension of opto-electronic circuit elements that have not been foreseen by the circuit designer.

FIG. 4C is a computer simulation of the effect of size changes to a mach-zehnder modulator (MZM) that can be made by, for example, silicon-photonics technology. More specifically, FIG. 4C illustrates the loss characteristics of an MZM at three different sizes, indicated by curves 421, 422 and 423. In some embodiments, the MZM is designed to operate at wavelengths between 1260 nanometers and 1550 nanometers.

Curve 421 indicates the loss characteristics of the MZM having a length exactly according to the value specified by the circuit designer. Curves 422 and 423 indicate the loss characteristics of the MZM having lengths that deviate from the value specified by the circuit designer; curves 422 and 423 correspond to a deviation of 1 nanometer and 4 nanometers, respectively.

Compared to curve 421, curve 422 shows a minimum loss at about the same wavelength of 1301.5 nanometers; however, a magnitude difference of 10 dB already exists. Compared to curve 421, curve 423 even shows a minimum at a different wavelength of about 1301.4 nanometers, and the loss at 1301.5 nanometers is also significantly higher.

At first glance, a 1-nanometer deviation in length does not seem to be expected to cause a significant effect as it only causes (1/1260)*100%=0.23% of deviation at a wavelength of 1260 nanometers. However, opto-electronic circuit systems may be designed to allow traversing rays with different operating wavelengths, and sometimes the spread of the operating wavelengths may be significant. For example, the refractive index of a waveguide may vary according to the wavelength of the traversing optical rays, and thus a 1-nanometer change in length may significantly impact some wavelengths. As another example, a resonating structure such as a ring oscillator may employ feedback to continuously create constructive or destructive optical interference with another optical path branch; thus, a small amount of deviation in size may be amplified by the feedback mechanism. Hence, only a 1-nanometer deviation in length may degrade the overall system performance. This effect may also exist in other circuit systems that require precise control of the element sizes, such as 3D IC devices.

Figure 5:
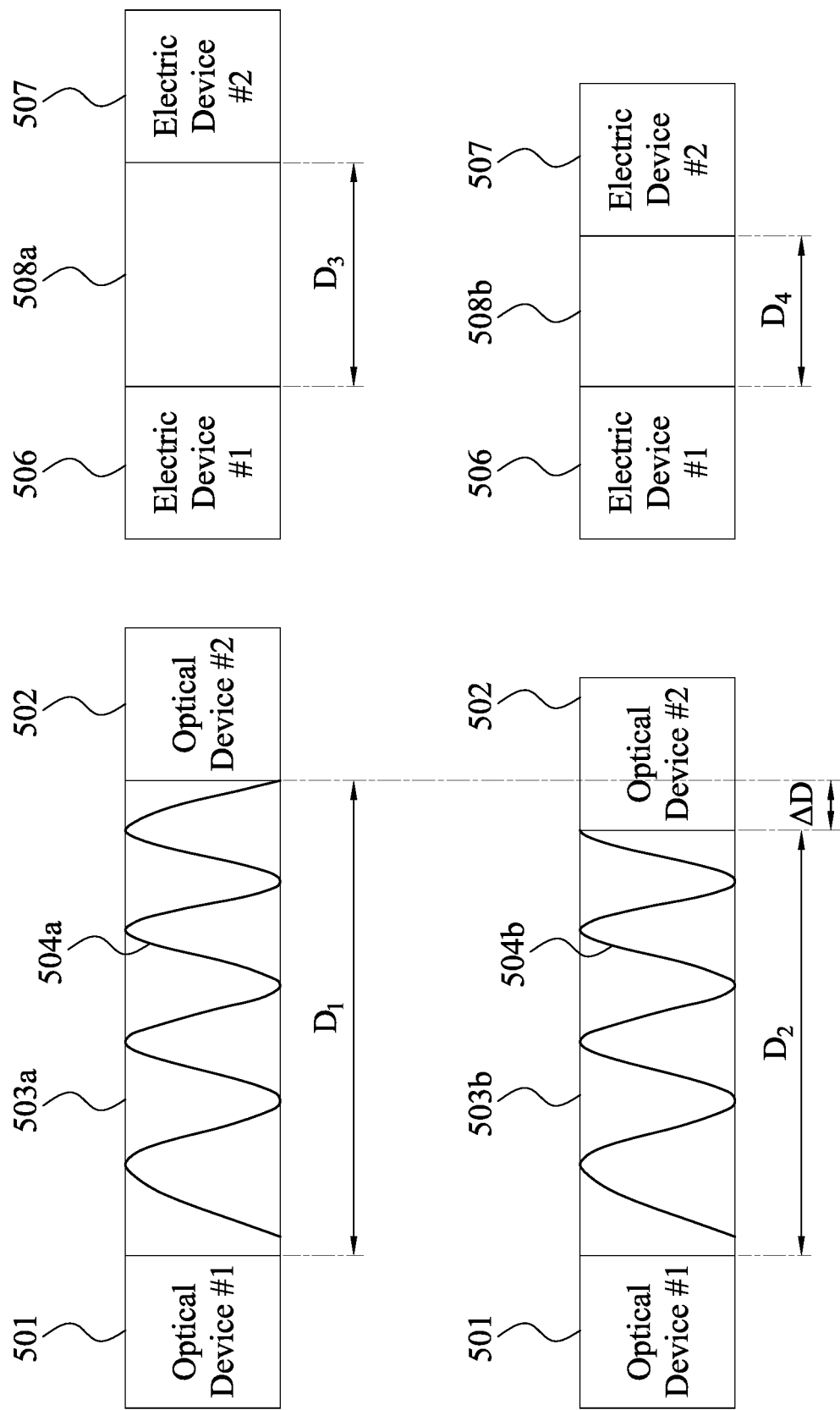
FIG. 5 illustrates various circuits, in accordance with some embodiments of the present disclosure.

FIG. 5 illustrates various circuits, in accordance with some embodiments of the present disclosure.

FIG. 5 illustrates four circuits. The first circuit includes opto-electronic devices 501, 502 and 503a, with the device 503a having a length $D_1$. The second circuit includes opto-electronic devices 501, 502 and 503b, with the device 503b having a length $D_2$ shorter than $D_1$. The third circuit includes electrical devices 506, 507 and 508a, with the device 508a having a length $D_3$. The fourth circuit includes electrical devices 506, 507 and 508b, with the device 508b having a length $D_4$ shorter than $D_3$. Optical signals 504a and 504b traverse devices 503a and 503b, respectively. Electrical signals (not shown) traverse devices 508a and 508b.

Optical signals 504a and 504b may exhibit wave characteristics, and therefore the signal phrases may vary along the lengths $D_1$ and $D_2$. Electrical signals in devices 508a and 508b do not exhibit wave characteristics, or at least the lengths $D_3$ and $D_4$ are sufficiently large so that the wave characteristics may be negligible.

Because of the wave characteristics, the difference $\Delta D$ may lead to a phase difference of the signal at the input of the opto-electronic device 502. The shorter the operating wavelength, the larger the phase difference is at a given amount of $\Delta D$. If the opto-electronic device 502 relies on the incoming signal having a specific phase value or range of values, then the length difference $\Delta D$ may degrade the circuit performance even if the magnitude of $\Delta D$ seems small relative to the lengths $D_1$ and $D_2$.

In contrast, the two electric circuits do not exhibit sufficient wave characteristics and hence may be insensitive to changes to the length of devices 508a and 508b that connect the devices 506 and 507.

In other words, FIG. 5 illustrates, in another manner, why the layout pattern 411-4 in FIG. 4B cannot be simply extended to come into contact with the layout pattern 411-5.

If layout 41 cannot be modified to eliminate the gap 422 while still conforming to the relevant grids and other applicable layout rules, then the schematic 40 will be sent back to the circuit designer for further modification. For example, the parameters of the symbols 401-2 and 401-3 may have to be tweaked to keep the same optical performance while accommodating the change of length of the symbol 401-4 that may be required for layout reasons. The back-and-forth between the circuit designer and layout engineer can be time-consuming and frustrating.

Some embodiments of the present disclosure provide improved methods that can let the circuit designer be aware of, at the schematic design stage, potential issues that may turn up in the layout stage. These potential issues may then be addressed early on in the schematic design stage, and the back-and-forth and trial-and-error between circuit designers and layout engineers can be reduced. The design and manufacturing cycle of IC devices may thus be shortened.

Figure 6A:
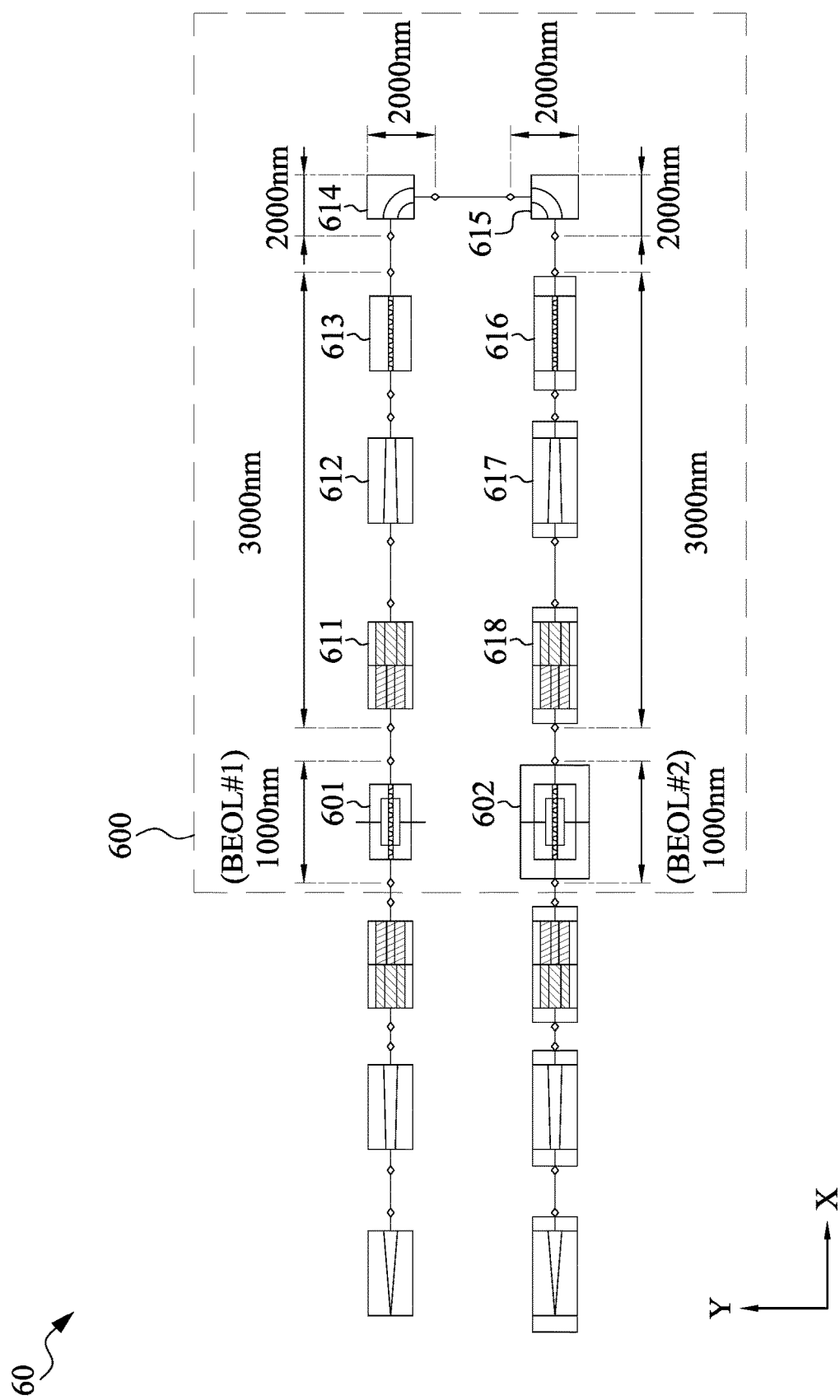
FIGS. 6A and 6C illustrate exemplary schematic diagrams, in accordance with some embodiments of the present disclosure.

FIG. 6A illustrates a schematic diagram 60, in accordance with some embodiments of the present disclosure. The methods provided according to some subject matters of the present disclosure may be applicable to the schematic diagram 60. In the following discussion, the term "schematic diagram" and "schematic" may be used interchangeably.

The schematic 60 includes a plurality of circuit symbols and how they are connected. The schematic 60 may represent a portion of a semiconductor-based IC. The schematic 60 may be turned into layout diagrams and then subsequently be fabricated accordingly. In some embodiments, the IC is made at least in part with a silicon-photonics process.

An identified portion 600 includes the circuit symbols to which the methods of the present disclosure may be applicable. The portion 600 includes symbols 601, 602, 611, 612, 613, 614, 615, 616, 617 and 618. Each of the symbols 601, 602 and 611 . . . 618 may have associated parameters reflecting the physical, electrical and/or optical properties of the circuit elements represented by these symbols. One exemplary parameter is the spatial dimension (such as length, width and radius) of the underlying circuit elements. In some embodiments, the portion 600 may be referred to as a net segment.

The group of symbols 601 and 602 may be referred to as edge elements, because they represent the first and last circuit elements in the chain of the circuit elements within the identified portion 600. In the example of FIG. 6A, the group of symbols 611, 612, 613, 614, 615, 616, 617 and 618 are between the edge elements.

The group of symbols 601 and 602 may represent circuit elements that are configured to be fabricated with a first lithographic process, and the group of symbols 611 . . . 618 may represent circuit elements that are configured to be fabricated with a second lithographic process having a resolution higher than the first lithographic process. In some embodiments, the layout patterns corresponding to the symbols 601 and 602 may be configured to conform to a first layout grid, and the layout patterns corresponding to the symbols 611 . . . 618 may be configured to conform to a second layout grid that is finer than the first layout grid. In some embodiments, the first layout grid may have a resolution of about 5, 6, 7, 8, 9 or 10 nanometers, or other suitable resolution. In some embodiments, the second layout grid may have a resolution of about 1 or 2 nanometers, or other suitable resolution.

In some embodiments, the symbols 601 and 602 may be identified by the fact that they represent circuit elements to be made with a less-advanced lithographic process than the symbols in between. The facts may be input by the circuit designer as symbols or system parameters, or other suitable methods compatible with the (EDA) schematic design tools.

In some embodiments, the symbols 601 and 602 may represent BEOL sections. In some embodiments, the symbols 611 . . . 618 may represent FEOL sections.

In some embodiments, at least one of the symbols 601 and 602 may include one or more of a conductive contact (CO), a via (VIA) and a conductive wire (in, e.g., a Metal layer). In some embodiments, at least one of the symbols 601 and 602 may include one or more of an optical phase shifter, a photo-detector, a photo-diode and an optical terminator.

In some embodiments, at least one of the symbols 611 . . . 618 may include one or more of a waveguide, a tap, a grating-coupler, a direct coupler, a ring resonator, a multi-mode interferometer and a Mach-Zehnder modulator. In some embodiments, at least one of the symbols 611 . . . 618 may include a waveguide configured to be made with a silicon-photonics process. In some embodiments, at least one of the symbols 611 . . . 618 may include a waveguide configured to operate at a wavelength between about 800 nanometers and about 1550 nanometers. In some embodiments, at least one of the symbols 611 . . . 618 may include a waveguide configured to operate at multiple wavelengths between about 800 nanometers and about 1550 nanometers. In some embodiments, the waveguide may be configured to operate at one or more wavelength ranges, such as one or more of between about 800 nanometers and about 900 nanometers, between about 1260 nanometers and 1360 nanometer, and between about 1450 nanometers and about 1550 nanometers. In some embodiments, the waveguide may be configured to operate at one or more of the wavelengths of about 850 nanometers, 1310 nanometers and 1550 nanometers.

As mentioned before, the spatial dimension (such as length, width and radius) of the underlying circuit elements may be a parameter of the associated symbols that the circuit designer can set in the schematic design stage. The symbols 601, 602 and 611 . . . 618 may thus be associated with at least one of a first dimension along a first direction and a second dimension along a second direction substantially perpendicular to the first direction.

In the example of FIG. 6A, the first direction is exemplarily shown as the X-direction, and the second direction is exemplarily shown as the Y-direction. In some embodiments, the symbols 601, 602 and 611 . . . 618 may be associated with the X- and Y-directions. An example is symbol 614, which represents an arc-shaped waveguide with a 90-degree bend, and therefore light may travel in both X- and Y-directions within the arc-shaped waveguide.

In the example of FIG. 6A, the symbols 601 and 602 are each associated with a circuit element having a length of 1000 nanometers in the X-direction. The groups of symbols 611 . . . 613 and 616 . . . 618 are each associated with a combined circuit element having a length of 3000 nanometers in the X-direction. The groups of symbols 614 and 615 are each associated with a circuit element having a length of 2000 nanometers in both the X- and Y-directions.

Figure 6B:
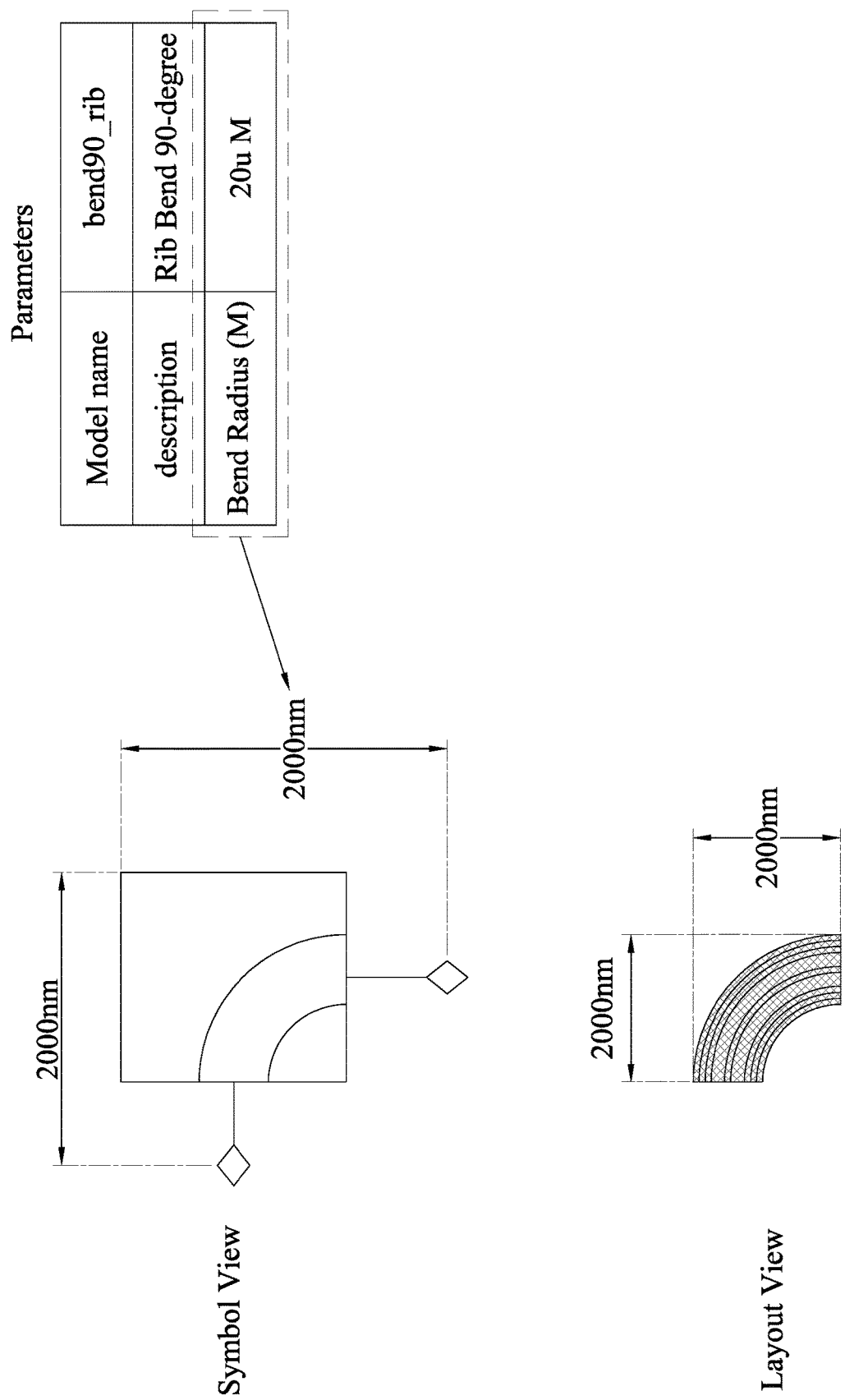
FIG. 6B shows various aspects of a circuit symbol, in accordance with some embodiments of the present disclosure.

FIG. 6B exemplarily shows the arc-shaped waveguide in the symbol view and the corresponding layout view. FIG. 6B also exemplarily shows the parameters that may be set by the circuit designer.

The layout diagram reflects the shape and size of the layout pattern that will actually be transferred to a wafer in fabrication. In contrast, the symbol shows a simplified figure to indicate the type/function of the circuit element; the two "terminals" in the symbol view, each consisting of a solid line segment and a rhombus, indicate that the waveguide has two end portions that can be connected to other devices but do not necessarily mean actual layout patterns in lines and rhombuses exist. The radius, in the unit of meters, indicates that the size of the waveguide is an adjustable parameter.

Refer back to FIG. 6A. In order to provide a timely warning to the circuit designer about a potential layout issue explained in relation to FIGS. 4A and 4B, the EDA tool utilized during schematic design may, in addition to identifying the edge elements and the intervening elements in the schematic, calculate a spatial quantity of a combined layout pattern corresponding to the symbols 611 . . . 618 between the edge elements (symbols 601 and 602). The calculation results may help determine whether the combined layout pattern conforms to the grid to which the layout patterns represented the symbols 601 and 602 conform to.

As a numerical example, the symbols 601 and 602 may represent BEOL sections (e.g., conduct contacts and interconnections) that are configured to be fabricated using a less advanced lithographic process, and the corresponding layout patterns conform to a grid with a unit grid size of 5 nanometers by 5 nanometers; the symbols 611 . . . 618, on the other hand, may represent FEOL sections (e.g., waveguides and active regions) that are configured to be fabricated using a more advanced lithographic process, and the corresponding layout patterns conform to a grid with a unit grid size of 1 nanometer by 1 nanometer.

The EDA tool may then calculate a sum of the X-dimension associated with each of the circuit symbols 611 . . . 618, which amounts to 3000+2000+(−3000)+(−2000)=0 nanometers, which can be divided by 5, indicating that the corresponding combined layout pattern will conform to the 5 nm×5 nm grid, and therefore a gap similar to the gap 422 in FIG. 4A would not arise in the X-direction. In this event, the EDA tool may generate a visible or audible signal indicating a satisfactory condition.

Some symbols, such as 613 and 614 may additionally have a Y-dimensional length. Hence, the EDA tool may also calculate a sum of the Y-dimension associated with each of the circuit symbols 613 and 614, which amounts 2000+2000=4000 nanometers, which can be divided by 5, indicating that the corresponding combined layout pattern will conform to the 5 nm×5 nm grid, and therefore a gap similar to the gap 422 in FIG. 4A would not arise in the Y-direction.

If, however, any one of the sums of lengths along the X- and Y-directions cannot be divided by 5, then the EDA tool can generate a visible or audible warning to warn the circuit designer that the current schematic design may lead to a problematic layout and advise him to readjust the circuit design.

In some embodiments, it is possible to calculate the magnitude of the relevant lengths, and the determination will not significantly change. For example, the X-directional sum may be 3000+2000+3000+2000=10000 and the Y-directional sum may be 2000+2000=4000, both of which can be divided by 5.

In some embodiments, the spatial quantity may be calculated by adding the lengths in the relevant direction(s) of all of the symbols 601, 602 and 611-618.

Knowing that the relevant circuit elements in the schematic 60 have layout-friendly spatial parameters, the circuit designer can send the finished schematic design to the layout engineers and have confidence that there will be fewer potential layout problems, and the design-and-manufacturing turnaround of IC devices that involve the improved methods of the present disclosure will be reduced. The IC devices can move smoothly through the layout stage, the mask(s) can be fabricated accordingly, and the IC devices can be fabricated by using the mask(s) to expose the wafer to radiation such as UV and EUV. Different circuit elements can be fabricated with the application of lithographic processes having different resolutions, and the cost and throughput of the fab can be optimized.

Figure 6C:
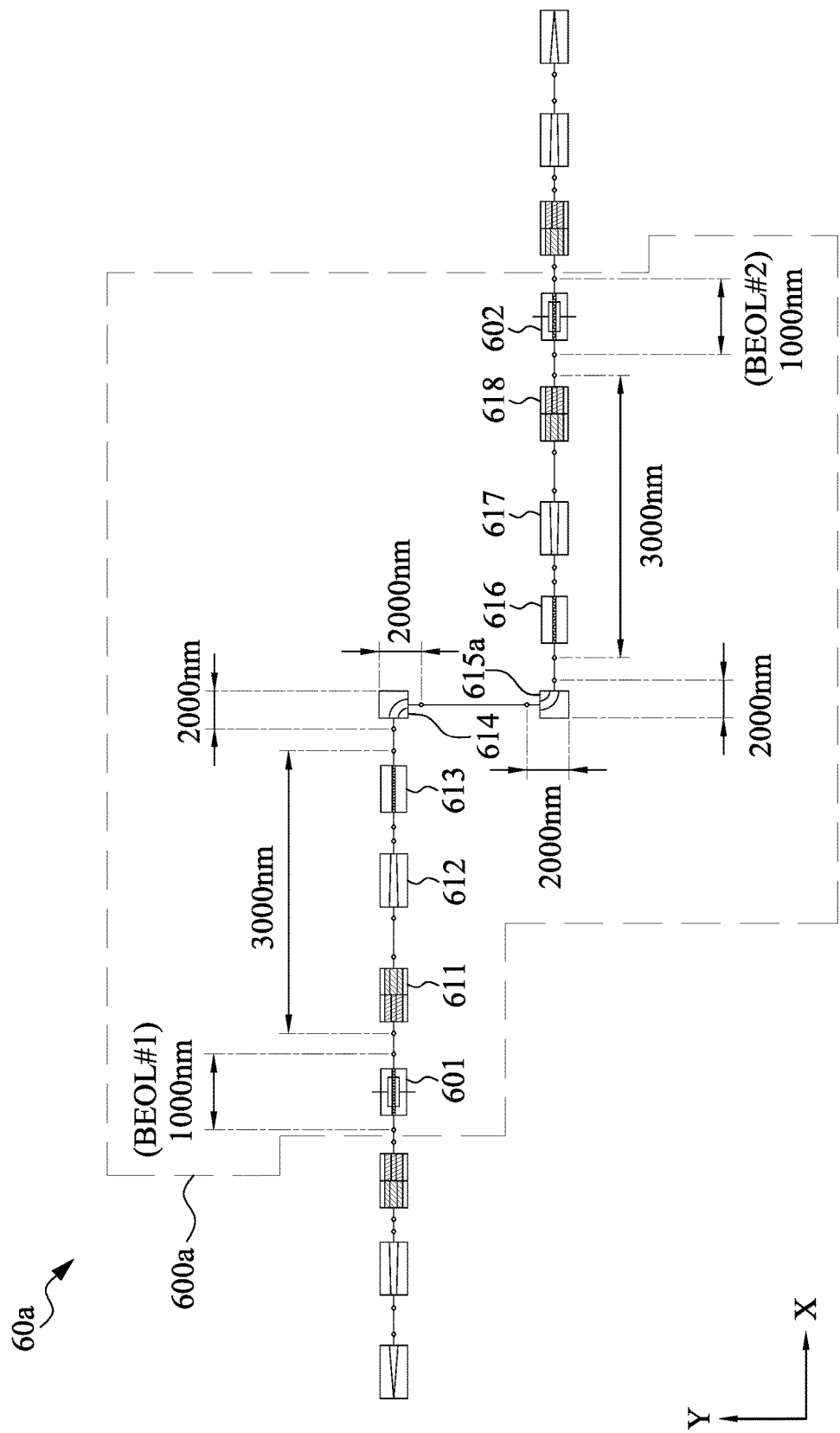

FIG. 6C illustrates another exemplary schematic diagram 60a, in accordance with some embodiments of the present disclosure.

The schematic diagram 60a is similar to the schematic diagram 60 in FIG. 6A. The main difference is the orientation of the arc-shaped waveguide represented by symbol 615a, but the methods applicable to the example of FIG. 6A are also applicable to the example of FIG. 6C.

Figure 7A:
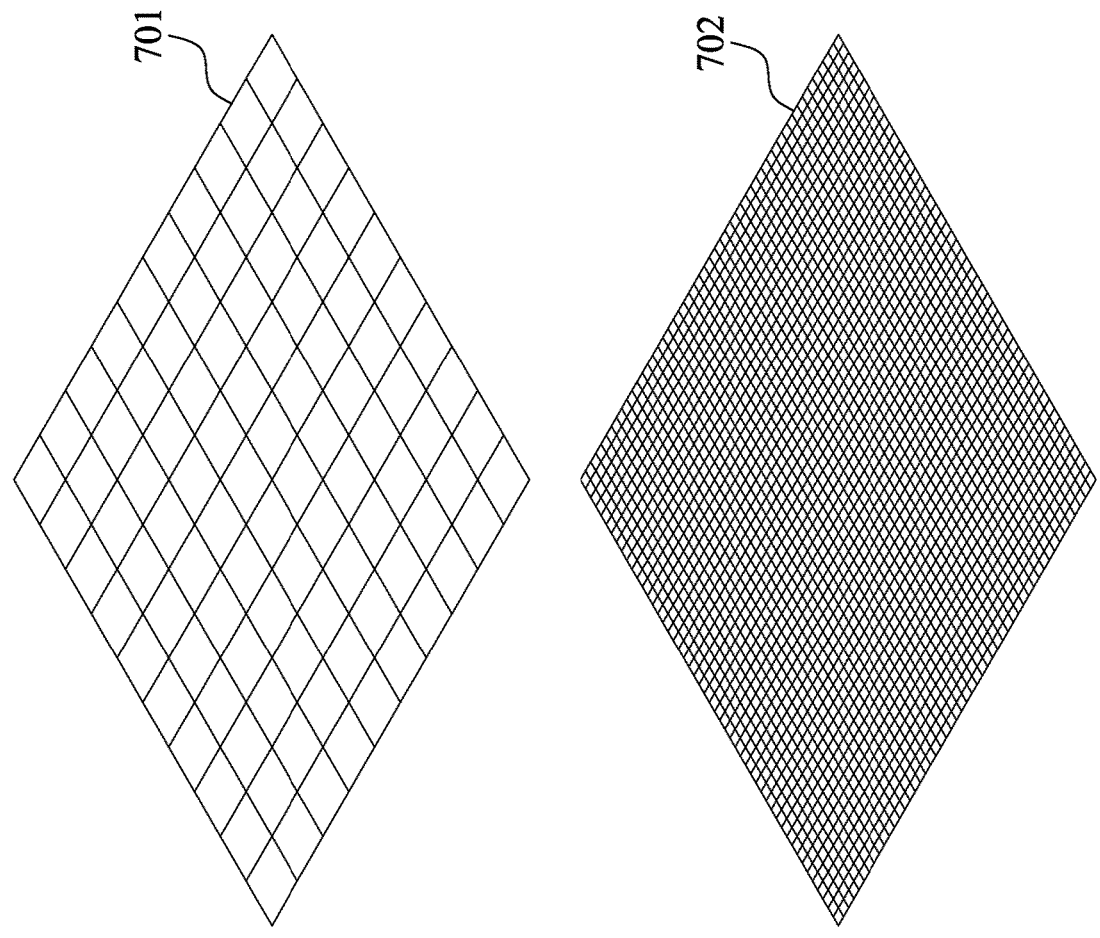
FIGS. 7A, 7B and 7C illustrate exemplary user interfaces (UI) of an EDA tool, in accordance with some embodiments of the present disclosure.
Figure 7A:
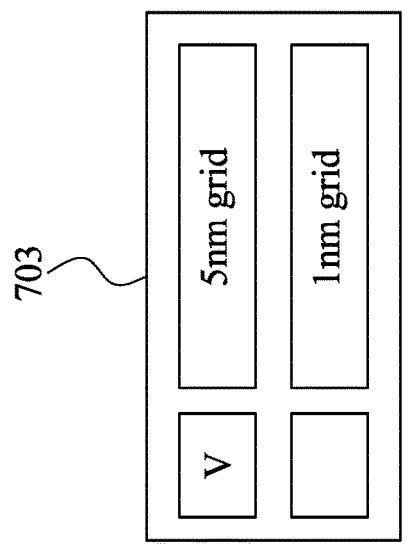

FIG. 7A illustrates an exemplary user interface (UI) of an EDA tool, in accordance with some embodiments of the present disclosure.

The EDA tool of the present embodiment may provide a dialog window 703 having two or more check boxes to let the layout engineer easily choose and know which grid is relevant to the circuit elements that are currently being designed. Simply with a click, the layout engineer can easily switch between a coarser grid 701 having a larger grid size and a finer grid 702 having a smaller grid size. This UI feature will increase working efficiency.

Figure 7B:
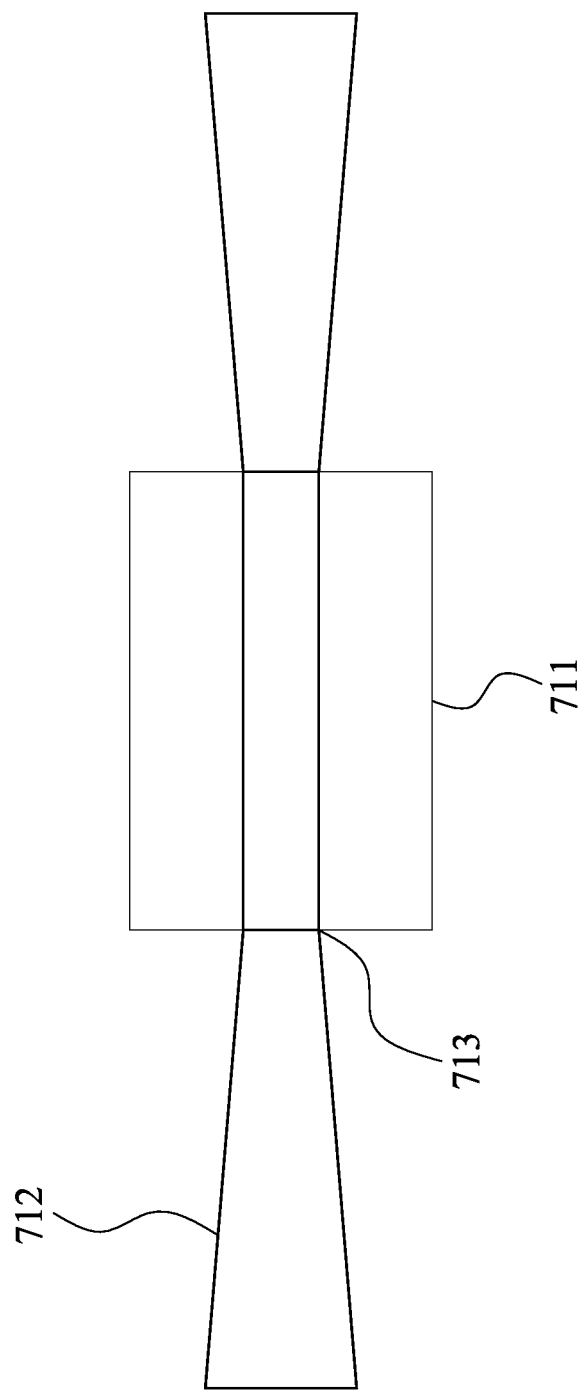

FIG. 7B illustrates an exemplary user interface (UI) of an EDA tool, in accordance with some embodiments of the present disclosure.

Two layout patterns 711 and 712 exist in the exemplary UI. The layout pattern 711 is arranged to conform to a 5 nm×5 nm grid, and the layout pattern 712 is arranged to conform to a 1 nm×1 nm grid. The layout engineer needs to ensure that the layout pattern 712 is "on" both grids. It can sometimes be tedious for the layout engineer to use a computer mouse to drag and move the layout pattern 711 slowly and carefully for 2, 3, 4 or even 5 1 nm×1 nm units to make sure that the end of the tapered sections lie on the gridlines of the 5 nm×5 nm grid. The exemplary UI of the present embodiment provides a "snapping" feature wherein having detected two differently sized grids, the UI can make the movement of the layout pattern 711 more quickly and jump to the next gridline of the 5 nm×5 nm grid, thereby saving time for the layout engineer.

Figure 7C:
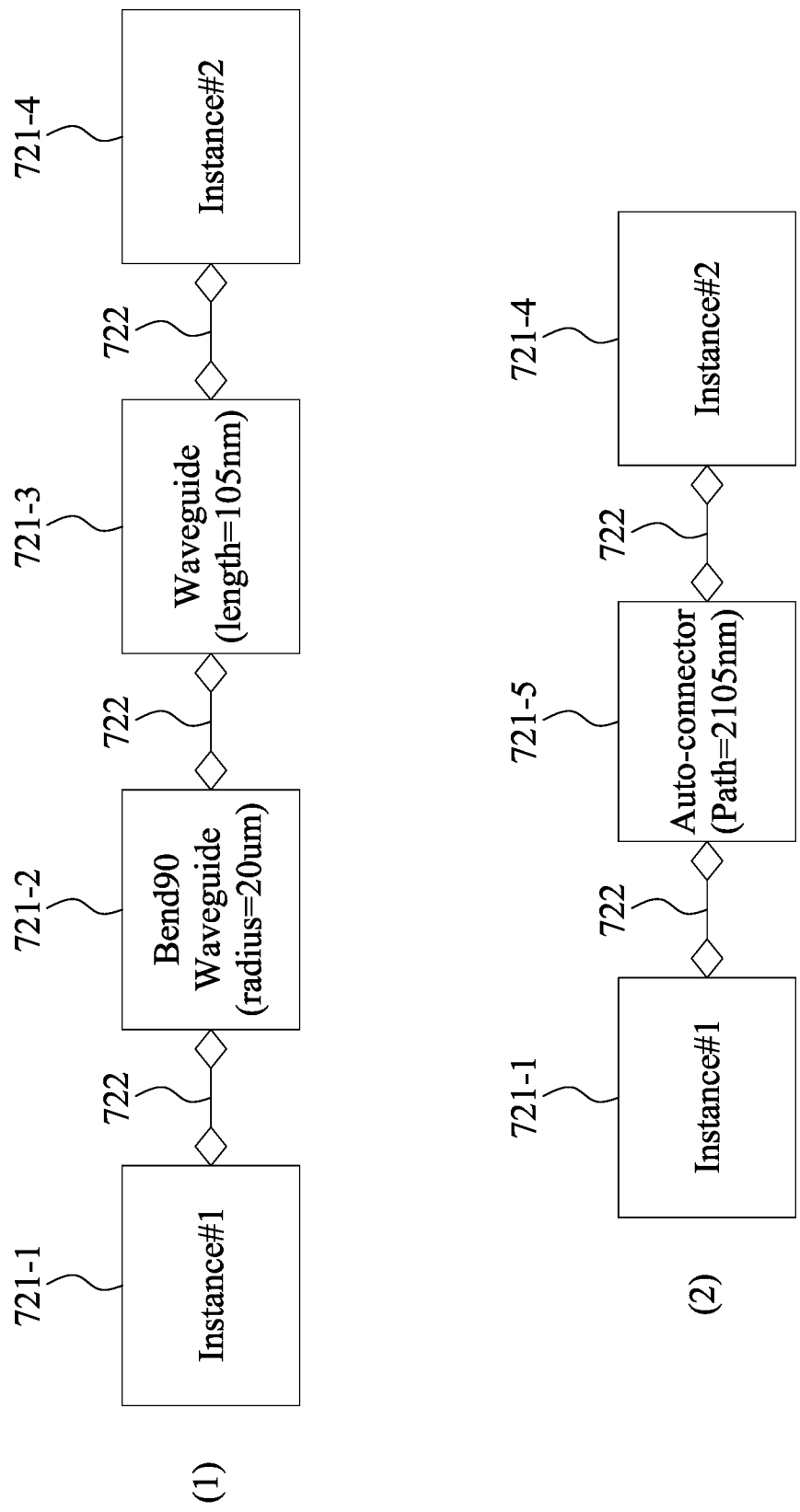

FIG. 7C illustrates an exemplary user interface (UI) of a schematic EDA tool, in accordance with some embodiments of the present disclosure.

FIG. 7C includes two schematics (1) and (2). Schematic (1) is similar to the schematic 40 in FIG. 4A and includes symbols 721-1, 721-2, 721-3, 721-4 and connection 722, in which the symbols 721-1 and 721-4 indicate BEOL sections and the symbols 721-2 and 721-3 indicate FEOL sections. The potential gap near the interface between the layout patterns corresponding to symbols 721-1 and 721-2 and/or 721-3 and 721-4 can be prevented with the methods explained in detail in relation to FIG. 6A.

The present disclosure provides other methods. Namely, the schematic EDA tool may be equipped with ready-to-use waveguides and/or other suitable optical or opto-electronic FEOL elements that are associated with pre-generated layout patterns that are known to conform to various layout requirements. With this EDA tool, the circuit designer may simply choose a connector symbol 721-5 and set the desired path length whenever he needs to connect two circuit elements or instances (such as 721-1 and 721-4) whose actual fabrication may involve a different lithographic process than that used to fabricate the FEOL elements.

Figure 8:
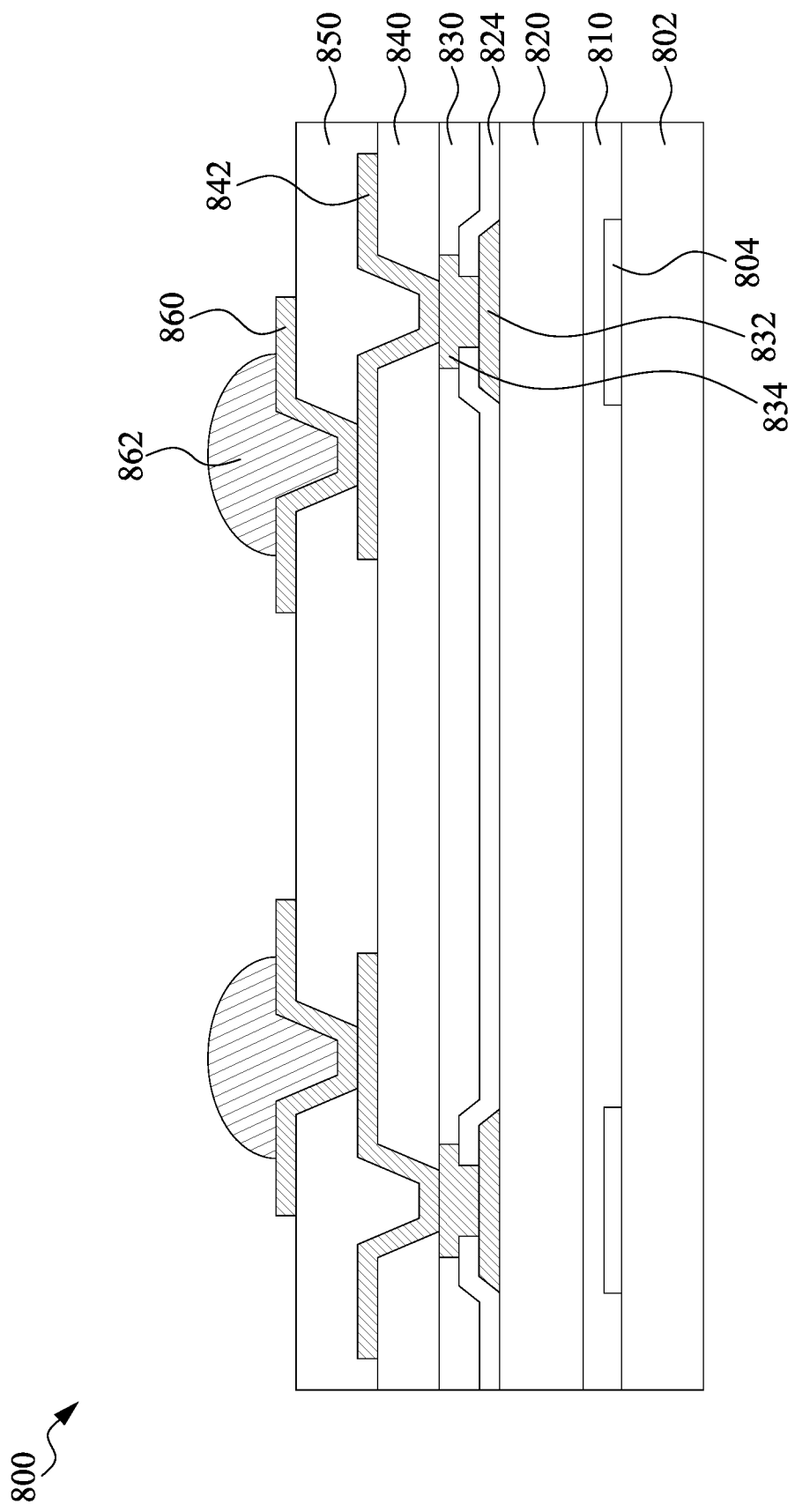
FIG. 8 shows a semiconductor device structure, in accordance with some embodiments of the present disclosure.

FIG. 8 shows a semiconductor device structure 800 that may be made based at least in part on the methods of some embodiments of the present disclosure.

The semiconductor device structure 800 may include a substrate 802, an inter-layer dielectric (ILD) layer 810 thereover, device elements 804 formed in the ILD layer 810, another ILD layer 820, conductive pads 832, passivation layer 824 that covers the edge portions of the conductive pads 832, a first protection layer 830, post-passivation interconnect (PPI) pads 834 formed therein, a second protection layer 840 with PPI structures 842 formed therein, a moisture-resistant layer 850, a under bump metallurgy (UBM) layer 860 formed therein, and conductive structures 862 formed on the UBM layer 860.

The substrate 802 may be made of silicon and/or other semiconductor materials such as germanium; of a compound semiconductor such as silicon carbide, gallium arsenic, indium arsenide, and indium phosphide; and of an alloy semiconductor such as silicon germanium, silicon germanium carbide, gallium arsenic phosphide, and gallium indium phosphide. In some embodiments, the substrate 802 includes an epitaxial layer, which may in turn overlie a bulk semiconductor. The substrate 802 may include doped regions such as p-type and/or n-type wells; and may further include isolation features (not shown), such as shallow trench isolation (STI) features or local oxidation of silicon (LOCOS) features.

The ILD layer 810 is made of silicon oxide ($SiO_x$), silicon nitride ($Si_xN_y$) or silicon oxynitride (SiON).

The device elements 804 include transistors (e.g., MOSFET, CMOS, BJT, high-voltage, high-frequency, and p-channel/n-channel field effect transistors (PFETs/NFETs), etc.)), diodes, and/or other applicable elements. Various processes are performed to form device elements 104, such as deposition, etching, implantation, photolithography, annealing, and/or other applicable processes. In some embodiments, device elements 804 are formed in the substrate 802 in a front-end-of-line (FEOL) process. In some embodiments, the device elements 804 may include optical or opto-electronic elements that are designed in accordance with the methods explained in connection with FIGS. 4A to 6C.

The IMD layer 820 may be made of silicon oxide ($SiO_x$), silicon nitride ($Si_xN_y$), silicon oxynitride (SiON), dielectric material(s) with low dielectric constant (low-k), or combinations thereof. The IMD layer 820 may be deposited by a plasma enhanced chemical vapor deposition (PECVD) process or by a spin coating process.

The conductive pads 832 are electrically connected to the device elements 804 through various conductive lines and vias in the IMD layer 820; and may be made of copper (Cu), copper alloy, aluminum (Al), aluminum alloy, tungsten (W), tungsten alloy, titanium (Ti), titanium alloy, tantalum (Ta) or tantalum alloy.

The IMD layer 820 and conductive pads 832 may be formed in a back-end-of-line (BEOL) process.

The passivation layer 824 may be made of non-organic materials, such as silicon oxide, un-doped silicate glass, silicon oxynitride, solder resist (SR), silicon nitride, and HMDS (hexamethyldisilazane); or of a polymer material, such as polyimide (PI), epoxy, and fluorine (F)-containing polymer.

The protection layers 830 and 840 may be made of polybenzoxazole (PBO), benzocyclobuten (BCB), silicone, acrylates, siloxane, or combinations thereof.

The PPI pads 834, the PPI structures 842 and the UBM layer 860 may be made of conductive material, such as Cu, Al, W, Ti, Ta or any suitable alloys thereof.

The moisture-resistant layer 850 may include inorganic materials or a polymer.

The conductive structures 862 may be a ball-like bump or a pillar, and may be made of conductive materials, such as tin (Sn), Cu, gold (Au), silver (Ag), alloys thereof, or other suitable materials.

The semiconductor device structure 800 may include layers/devices/sections fabricated with lithographic processes having different resolutions. The circuit elements in these layers/devices/sections may be designed with the aid of the methods of the present disclosure explained in connection with the previous drawings.

Figure 9:
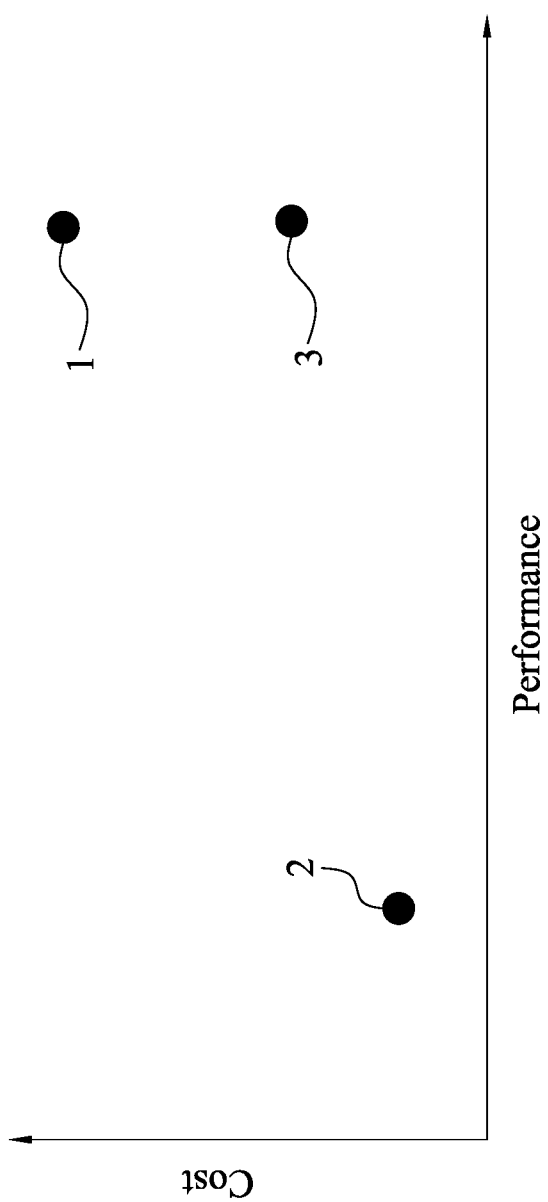
FIG. 9 illustrates an analysis of the cost-performance of different methods for making IC devices, in accordance with some embodiments of the present disclosure.

FIG. 9 illustrates an analysis of the cost-performance of different methods for making IC devices containing both FEOL and BEOL sections.

Point 1 indicates that both FEOL and BEOL sections are fabricated with the same advanced lithography (i.e., employing lithographic apparatuses that are capable of a very high resolution). The performance is high, but so is the cost because advanced lithography is used on BEOL sections, some types of which do not necessarily require a very fine resolution.

Point 2 indicates that both FEOL and BEOL sections are fabricated with the same less-advanced lithography (i.e., employing lithographic apparatuses that are capable of only a relatively low resolution). The cost is low, but so is the performance.

Point 3 indicates a sweet spot, where the FEOL sections (which usually require high density or precise control of the size of the exposed patterns) are fabricated with advanced lithography, and the BEOL sections (which do not usually require equally high density or equally precise control of the size of the exposed patterns) are fabricated with less-advanced lithography. The performance is comparable to the situation indicated by point 1, with a lower cost and a potentially better throughput. The optimized cost-performance relationship can be attributed to the insight behind at least some embodiments of the present disclosure that costly lithography can be reserved for only the circuit elements that demand a commensurate high performance. The optimized cost-performance relationship can also be attributed to the insight behind at least some embodiments of the present disclosure that a circuit designer may be informed as early as the schematic design stage about circuit parameters that can lead to a satisfactory layout.

Figure 11:
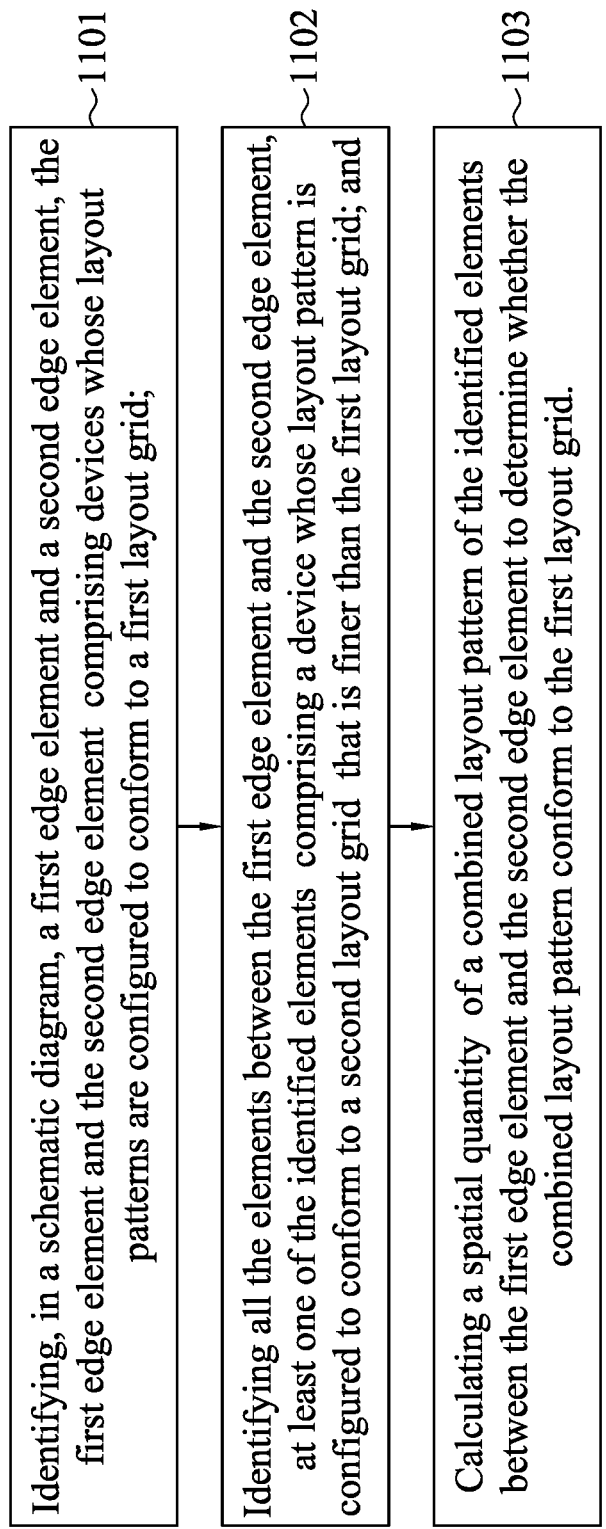
FIGS. 11-13 illustrate exemplary flowcharts for making ICs, in accordance with some embodiments of the present disclosure.

FIG. 11 illustrates an exemplary flowchart for making a semiconductor-based integrated circuit, in accordance with some embodiments of the present disclosure. At step 1101, a first edge element and a second edge element are identified in a schematic diagram, where the first edge element and the second edge element may comprise devices whose layout patterns are configured to conform to a first layout grid. At step 1102, all the elements between the first edge element and the second edge element are identified, where at least one of the identified elements may comprise a device whose layout pattern is configured to conform to a second layout grid that is finer than the first layout grid. At step 1103, a spatial quantity of a combined layout pattern of the identified elements between the first edge element and the second edge element may be calculated to determine whether the combined layout pattern conform to the first layout grid.

Figure 12:
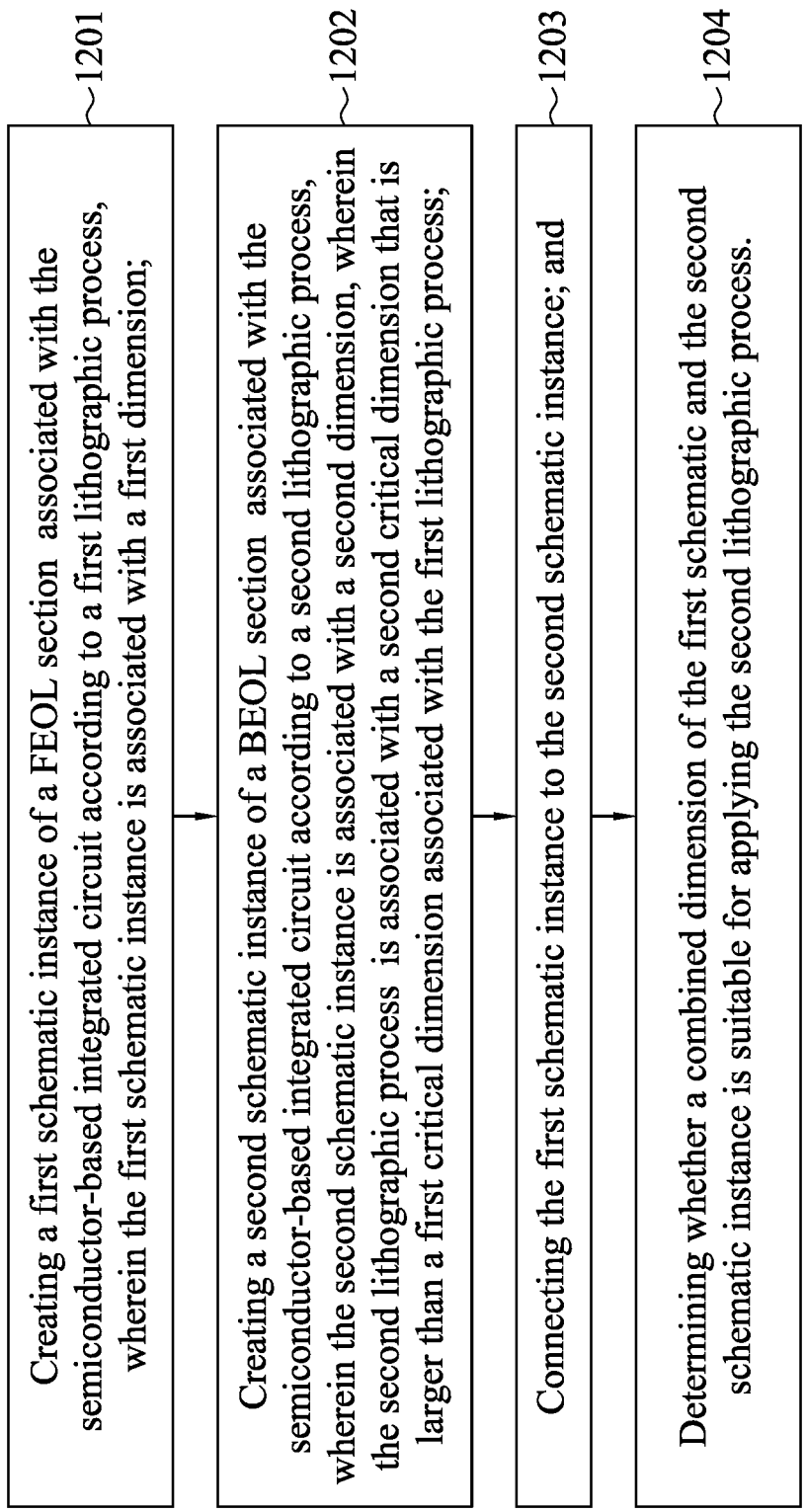

FIG. 12 illustrates an exemplary flowchart for making a semiconductor-based integrated circuit, in accordance with some embodiments of the present disclosure. At step 1201, a first schematic instance of a FEOL section associated with the semiconductor-based integrated circuit according to a first lithographic process may be created, where the first schematic instance is associated with a first dimension. At step 1202, a second schematic instance of a BEOL section associated with the semiconductor-based integrated circuit according to a second lithographic process, wherein the second schematic instance is associated with a second dimension may be created, where the second lithographic process is associated with a second critical dimension that is larger than a first critical dimension associated with the first lithographic process. At step 1203, the first schematic instance may be connected to the second schematic instance. At step 1204, it is determined whether a combined dimension of the first schematic and the second schematic instance is suitable for applying the second lithographic process.

Figure 13:
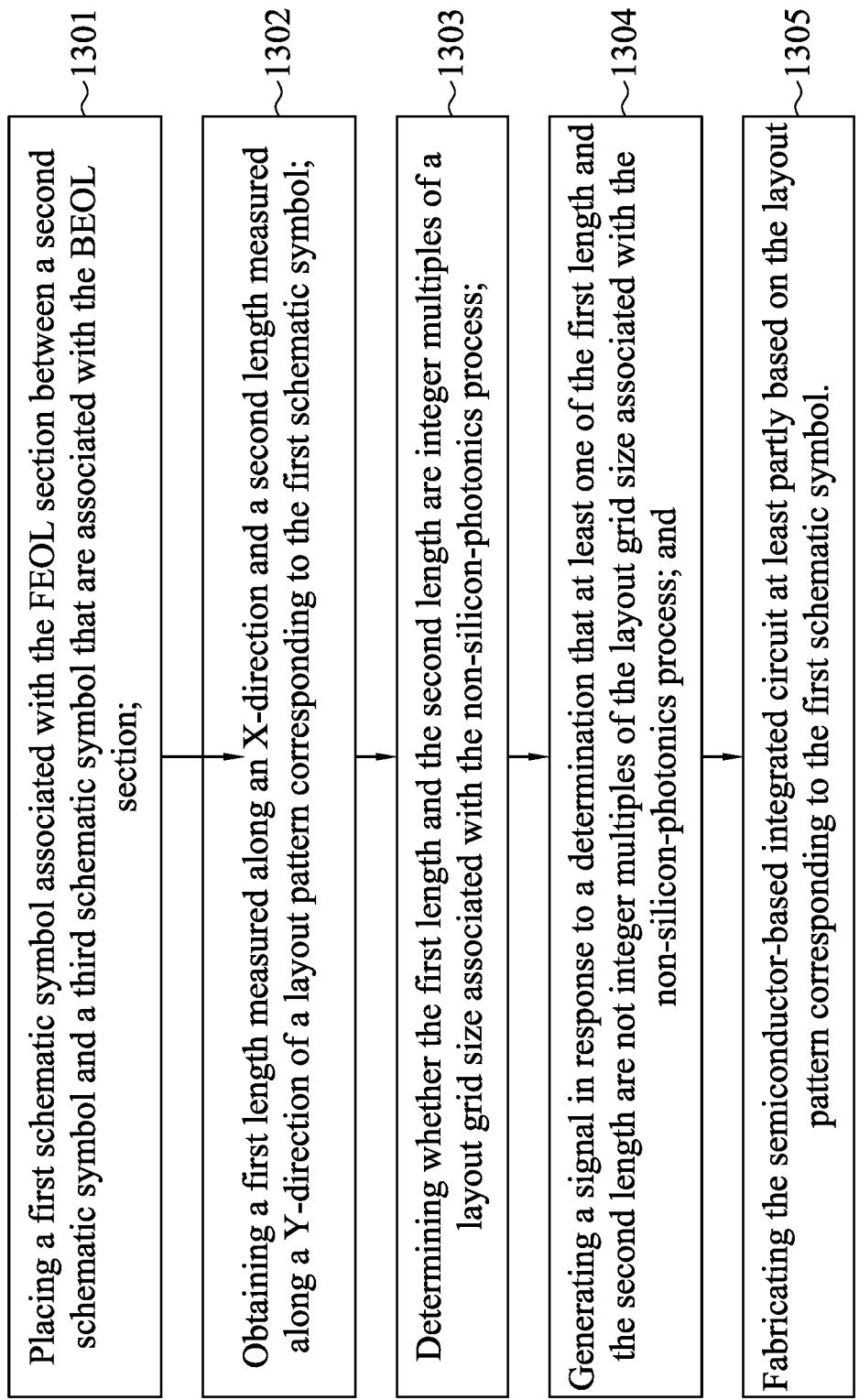

FIG. 13 illustrates an exemplary flowchart for making a semiconductor-based integrated circuit, in accordance with some embodiments of the present disclosure. The semiconductor-based integrated circuit may include a front-end-of-line (FEOL) section and a back-end-of-line (BEOL) section, where the FEOL section is fabricated with a silicon-photonics process and the BEOL section is fabricated with a non-silicon-photonics process. The non-silicon-photonics process may include a 90-nm process, 65-nm process, 45-nm process, 32-nm process, 22-nm process, 14-nm process, 10-nm process, or any other suitable processes.

At step 1301, a first schematic symbol associated with the FEOL section may be placed between a second schematic symbol and a third schematic symbol that are associated with the BEOL section. At step 1302, a first length measured along an X-direction and a second length measured along a Y-direction of a layout pattern corresponding to the first schematic symbol are obtained. At step 1303, it may be determined whether the first length and the second length are integer multiples of a layout grid size associated with the non-silicon-photonics process. At step 1304, a signal may be generated in response to a determination that at least one of the first length and the second length are not integer multiples of the layout grid size associated with the non-silicon-photonics process. At step 1305, the semiconductor-based integrated circuit may be fabricated at least partly based on the layout pattern corresponding to the first schematic symbol.

In the present disclosure, the IC device may be more quickly designed and manufactured by determining, in the schematic design phase, whether the current schematic design may cause problems in the layout. The manufacturing cost may be reduced by employing different lithographic processes for circuit elements that require different performance.

Any of the embodiments described herein may be used alone or together in any combination. The one or more implementations encompassed within this specification may also include embodiments that are only partially mentioned or alluded to or not mentioned or alluded to at all in this brief summary or in the abstract. Although various embodiments may have been motivated by various deficiencies in the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

It will be understood that not all advantages have been necessarily discussed herein, no particular advantage is required for all embodiments or examples, and other embodiments or examples may offer different advantages.

According to an aspect of the present disclosure, a method for making a semiconductor-based integrated circuit, the method including: identifying, in a schematic diagram, a first edge element and a second edge element, the first edge element and the second edge element including devices whose layout patterns are configured to conform to a first layout grid; identifying all the elements between the first edge element and the second edge element, at least one of the identified elements including a device whose layout pattern is configured to conform to a second layout grid that is finer than the first layout grid; calculating a spatial quantity of a combined layout pattern of the identified elements between the first edge element and the second edge element; determining, based on the calculated spatial quantity, whether the combined layout pattern conform to the first layout grid; converting, in response to the determination that the combined layout pattern conforms to the first layout grid, the combined layout pattern into a data file; and exposing, using a mask fabricated according to the data file, a semiconductor-based wafer to radiation.

In an embodiment, the first layout grid may have a resolution of about 5 nanometers. In an embodiment, the second layout grid may have a resolution of about 1 nanometer.

In an embodiment, the method may further include fabricating a mask according to the combined layout pattern. In an embodiment, the method may further include exposing, using the mask, a semiconductor-based wafer to radiation. In an embodiment, the method may further include fabricating the semiconductor-based integrated circuit from the exposed semiconductor-based wafer.

According to an aspect of the present disclosure, a system including a non-transitory computer-readable medium storing program instructions; and a processor operatively coupled to the non-transitory computer-readable medium, wherein the program instructions, when executed by the processor, cause the processor to perform: creating a first schematic instance of a front-end-of-line (FEOL) section associated with the semiconductor-based integrated circuit according to a first lithographic process, wherein the first schematic instance is associated with a first dimension; creating a second schematic instance of a back-end-of-line (BEOL) section associated with the semiconductor-based integrated circuit according to a second lithographic process, wherein the second schematic instance is associated with a second dimension, wherein the second lithographic process is associated with a second critical dimension that is larger than a first critical dimension associated with the first lithographic process; connecting the first schematic instance to the second schematic instance; and determining whether a combined dimension of the first schematic instance and the second schematic instance is suitable for applying the second lithographic process; and converting, in response to a determination that the combined dimension of the first schematic instance and the second schematic instance is suitable for applying the second lithographic process, the first schematic instance and the second schematic instance into a layout.

According to an aspect of the present disclosure, a method for making a semiconductor-based integrated circuit including a front-end-of-line (FEOL) section and a back-end-of-line (BEOL) section, wherein the FEOL section is fabricated with a silicon-photonics process and the BEOL section is fabricated with a non-silicon-photonics process, the method including: placing a first schematic symbol associated with the FEOL section between a second schematic symbol and a third schematic symbol that are associated with the BEOL section; obtaining a first length measured along an X-direction and a second length measured along a Y-direction of a layout pattern corresponding to the first schematic symbol; determining whether the first length and the second length are integer multiples of a layout grid size associated with the non-silicon-photonics process; generating a warning signal in response to a determination that at least one of the first length and the second length are not integer multiples of the layout grid size associated with the non-silicon-photonics process; and fabricating, in response to a determination that the first length and the second length are integer multiples of the layout grid size associated with the non-silicon-photonics process, the semiconductor-based integrated circuit at least partly based on the layout pattern corresponding to the first schematic symbol.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for making a semiconductor-based integrated circuit, the method comprising:
   creating a first schematic instance of a front-end-of-line (FEOL) section associated with a semiconductor-based integrated circuit according to a first lithographic process, wherein the first schematic instance is associated with a first dimension;
   creating a second schematic instance of a back-end-of-line (BEOL) section associated with the semiconductor-based integrated circuit according to a second lithographic process, wherein the second schematic instance is associated with a second dimension, wherein the second lithographic process is associated with a second critical dimension that is larger than a first critical dimension associated with the first lithographic process;
   connecting the first schematic instance to the second schematic instance;
   determining whether a combined dimension of the first schematic instance and the second schematic instance is suitable for applying the second lithographic process; and
   converting, in response to a determination that the combined dimension of the first schematic instance and the second schematic instance is suitable for applying the second lithographic process, the first schematic instance and the second schematic instance into a layout.

2. The method of claim 1, wherein the first lithographic process is associated with a lithographic apparatus that generates extreme ultraviolet (EUV) radiation.

3. The method of claim 1, wherein the FEOL section is to be fabricated on the semiconductor-based integrated circuit by the first lithographic process, and wherein the BEOL section is to be fabricated on the semiconductor-based integrated circuit by the second lithographic process.

4. The method of claim 1, wherein each of the first dimension and the second dimension comprises a first length measured along a first direction and a second length measured along a second direction substantially perpendicular to the first direction.

5. The method of claim 4, wherein determining whether a combined dimension of the first schematic instance and the second schematic instance is suitable for applying the second lithographic process comprises:
generating a first sum by adding the first length of the first dimension;
generating a second sum by adding the second length of the second dimension; and
determining whether the first sum and the second sum are integer multiples of a grid size associated with the second critical dimension.

6. The method of claim 1, further comprising:
generating a layout from the connected first schematic instance and second schematic instance for fabricating a photomask for fabricating the semiconductor-based integrated circuit.

7. A method for making a semiconductor-based integrated circuit, the method comprising:
creating a first schematic instance of a plurality of front-end-of-line (FEOL) sections associated with a semiconductor-based integrated circuit according to a first lithographic process;
creating a second schematic instance of a first back-end-of-line (BEOL) section and a second BEOL section associated with the semiconductor-based integrated circuit according to a second lithographic process;
connecting the first schematic instance to the second schematic instance, wherein the plurality of FEOL sections are placed between the first BEOL section and the second BEOL section;
determining whether a combined dimension of the first schematic instance and the second schematic instance is suitable for applying the second lithographic process; and
converting, in response to a determination that the combined dimension of the first schematic instance and the second schematic instance is suitable for applying the second lithographic process, the first schematic instance and the second schematic instance into a layout.

8. The method of claim 7, wherein the second lithographic process is associated with a second critical dimension that is larger than a first critical dimension associated with the first lithographic process.

9. The method of claim 8, wherein at least one of the FEOL sections comprises a device whose layout pattern is configured to conform to a first layout grid, and the first BEOL section and the second BEOL section comprises devices whose layout patterns are configured to conform to a second layout grid and that is more coarse than the first layout grid.

10. The method of claim 9, wherein each of the FEOL sections is associated with at least one of a first dimension along a first direction and a second dimension along a second direction substantially perpendicular to the first direction.

11. The method of claim 10, wherein determining whether a combined dimension of the first schematic instance and the second schematic instance is suitable for applying the second lithographic process comprises:
calculating a first sum of the first dimension of each of the FEOL sections;
calculating a second sum of the second dimension of each of the FEOL sections; and
determining, based on the calculated first sum and the calculated second sum, whether the combined dimension of the first schematic instance and the second schematic instance is suitable for applying the second lithographic process.

12. The method of claim 11, wherein determining, based on the calculated first sum and the calculated second sum, whether the combined dimension of the first schematic instance and the second schematic instance is suitable for applying the second lithographic process comprises:
determining, in response to both the calculated first sum and the calculated second sum being integer multiples of a layout grid size of the second layout grid, that the combined dimension of the first schematic instance and the second schematic instance is suitable for applying the second lithographic process; and
determining, in response to both the calculated first sum and the calculated second sum not being integer multiples of the layout grid size of the second layout grid, that the combined dimension of the first schematic instance and the second schematic instance is not suitable for applying the second lithographic process.

13. The method of claim 7, wherein the first lithography process is a silicon-photonics process, and the second lithography process is a non-silicon-photonic process.

14. The method of claim 12, wherein the first layout grid has a resolution of about 1 nanometers, and the second layout grid has a resolution of about 5 nanometer.

15. A system comprising a non-transitory computer-readable medium storing program instructions that, when executed by a processor, cause the processor to:
create a first schematic instance having a first edge element and a second edge element associated with a semiconductor-based integrated circuit according to a first lithographic process using a first layout grid;
create a second schematic instance having a plurality of intermediate elements associated with the semiconductor-based integrated circuit according to a second lithographic process using a second layout grid that is finer than the first layout grid;
connect the first schematic instance to the second schematic instance;
determine whether a combined dimension of the first schematic instance and the second schematic instance is suitable for applying the second lithographic process; and
convert, in response to a determination that the combined dimension of the first schematic instance and the second schematic instance is suitable for applying the second lithographic process, the first schematic instance and the second schematic instance into a layout.

16. The system of claim 15, wherein the intermediate elements are placed between the first edge element and the second edge element.

17. The system of claim 16, wherein the first edge element and the second edge element represent back-end-of-line (BEOL) sections, and the intermediate elements represent front-end-of-line (FEOL) sections.

18. The system of claim 15, wherein a first critical dimension associated with the first lithographic process is larger than a second critical dimension associated with the second lithographic process.

19. The system of claim 15, wherein when determining whether the combined dimension of the first schematic instance and the second schematic instance is suitable for applying the second lithographic process, the processor is further configured to:
- calculate a first sum of a first dimension of each of the intermediate elements along a first direction;
- calculate a second sum of a second dimension of each of the intermediate elements along a second direction substantially perpendicular to the first direction; and
- determining, based on the calculated first sum and the calculated second sum, whether the combined dimension of the first schematic instance and the second schematic instance is suitable for applying the second lithographic process.

20. The system of claim 19, wherein when determining, based on the calculated first sum and the calculated second sum, whether the combined dimension of the first schematic instance and the second schematic instance is suitable for applying the second lithographic process, the processor is further configured to:
- determine, in response to both the calculated first sum and the calculated second sum being integer multiples of a layout grid size of the first layout grid, that the combined dimension of the first schematic instance and the second schematic instance is suitable for applying the second lithographic process; and
- determine, in response to both the calculated first sum and the calculated second sum not being integer multiples of the layout grid size of the first layout grid, that the combined dimension of the first schematic instance and the second schematic instance is not suitable for applying the second lithographic process.

* * * * *